United States Patent
Sonoda et al.

(10) Patent No.: US 9,741,932 B2
(45) Date of Patent: Aug. 22, 2017

(54) VAPOR DEPOSITION METHOD AND METHOD FOR PRODUCING AN ORGANIC ELECTROLUMINESCENCE DISPLAY DEVICE

(71) Applicant: Sharp Kabushiki Kaisha, Osaka (JP)

(72) Inventors: Tohru Sonoda, Osaka (JP); Shinichi Kawato, Osaka (JP); Satoshi Inoue, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 15/094,902

(22) Filed: Apr. 8, 2016

(65) Prior Publication Data
US 2016/0260902 A1     Sep. 8, 2016

Related U.S. Application Data

(62) Division of application No. 13/879,761, filed as application No. PCT/JP2011/073426 on Oct. 12, 2011, now abandoned.

(30) Foreign Application Priority Data

Oct. 19, 2010   (JP) .................... 2010-234625

(51) Int. Cl.
*H01L 51/00*     (2006.01)
*H01L 51/56*     (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
None
See application file for complete search history.

(56) References Cited

U.S. PATENT DOCUMENTS 5,688,551 A    11/1997  Littman et al.
5,701,055 A    12/1997  Nagayama et al.
(Continued)

FOREIGN PATENT DOCUMENTS

JP     8-227276 A    9/1996
JP     9-167684 A    6/1997
(Continued)

OTHER PUBLICATIONS

International Search Report for PCT Application No. PCT/JP2011/073426 mailed Dec. 27, 2011; Total 4 pages (2 pages English translation and 2 pages of PCT search report).
(Continued)

*Primary Examiner* — Joseph Miller, Jr.
(74) *Attorney, Agent, or Firm* — Morrison & Foerster LLP

(57) ABSTRACT

A vapor deposition device (50) disclosed, a partition wall (26) standing between film formation regions on a film formation substrate (200), includes: a mask unit (80) including a shadow mask (81) and a vapor deposition source (85) fixed in position relative to each other; contacting means for bringing the film formation substrate (200) and the shadow mask (81) into contact with each other at the partition wall (26); and moving means for moving at least a first one of the mask unit (80) and the film formation substrate (200) relative to a second one thereof in a state in which the contact caused by the contacting means is kept.

16 Claims, 25 Drawing Sheets

(51) Int. Cl.
- *C23C 14/04* (2006.01)
- *C23C 14/12* (2006.01)
- *C23C 16/04* (2006.01)
- *H05B 33/10* (2006.01)
- *C23C 14/24* (2006.01)
- *C23C 14/50* (2006.01)
- *H01L 27/32* (2006.01)

(52) U.S. Cl.
CPC ............ *C23C 14/24* (2013.01); *C23C 14/50* (2013.01); *C23C 16/042* (2013.01); *H01L 27/3244* (2013.01); *H01L 51/001* (2013.01); *H01L 51/56* (2013.01); *H05B 33/10* (2013.01); *H01L 27/3211* (2013.01); *H01L 2227/323* (2013.01)

(56) References Cited

U.S. PATENT DOCUMENTS

| | | | |
|---|---|---|---|
| 5,742,129 A | 4/1998 | Miyaguchi et al. | |
| 6,294,892 B1 | 9/2001 | Utsugi et al. | |
| 7,651,722 B2 | 1/2010 | Mori et al. | |
| 2001/0004469 A1 | 6/2001 | Himeshima et al. | |
| 2001/0006827 A1 | 7/2001 | Yamazaki et al. | |
| 2005/0287897 A1* | 12/2005 | Tanaka | C23C 14/042 445/24 |
| 2006/0011136 A1 | 1/2006 | Yamazaki et al. | |
| 2007/0085475 A1 | 4/2007 | Kuwabara et al. | |
| 2009/0104721 A1 | 4/2009 | Hirakata et al. | |
| 2010/0055810 A1 | 3/2010 | Sung et al. | |
| 2010/0311248 A1* | 12/2010 | Knechtel | B81C 1/0038 438/758 |

FOREIGN PATENT DOCUMENTS

| | | |
|---|---|---|
| JP | 2000-96211 A | 4/2000 |
| JP | 2000-188179 A | 7/2000 |
| JP | 2004-103341 A | 4/2004 |
| JP | 2006-28583 A | 2/2006 |
| JP | 2007-141821 A | 6/2007 |
| JP | 2009-277510 A | 11/2009 |
| JP | 2010-116591 A | 5/2010 |

OTHER PUBLICATIONS

Restriction Requirement received for U.S. Appl. No. 13/879,761, mailed on Dec. 6, 2013, 8 pages.
Non-Final Office Action received for U.S. Appl. No. 13/879,761, mailed on Feb. 14, 2014, 16 pages.
Final Office Action received for U.S. Appl. No. 13/879,761, mailed on Jul. 9, 2014, 28 pages.
Advisory Action received for U.S. Appl. No. 13/879,761, mailed on Sep. 17, 2014, 3 pages.
Non-Final Office Action received for U.S. Appl. No. 13/879,761, mailed on Oct. 23, 2014, 24 pages.
Final Office Action received for U.S. Appl. No. 13/879,761, mailed on Feb. 13, 2015, 26 pages.
Advisory Action received for U.S. Appl. No. 13/879,761, mailed on Apr. 29, 2015, 8 pages.

* cited by examiner

F I G. 1
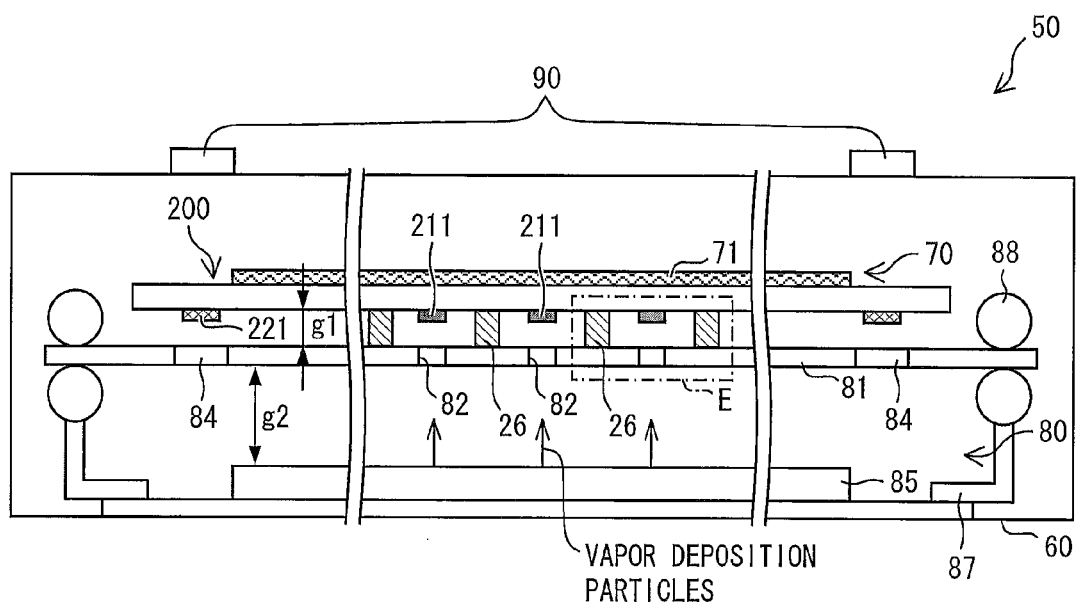

F I G. 2
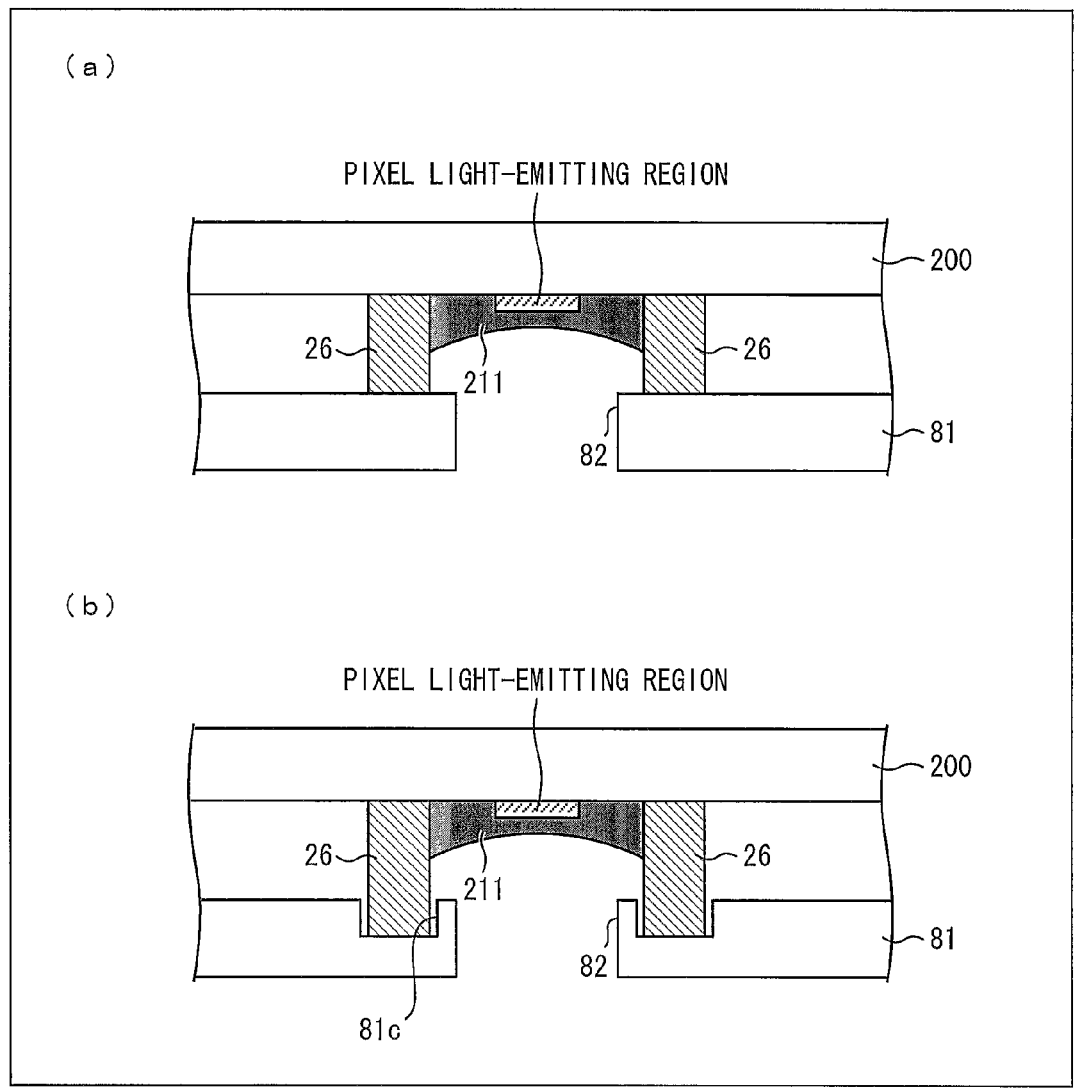
F I G. 3
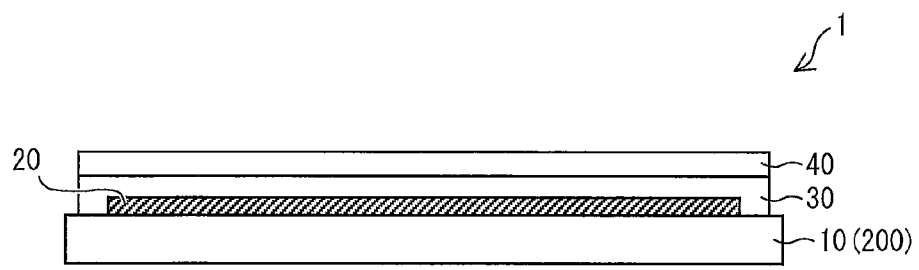

F I G. 6
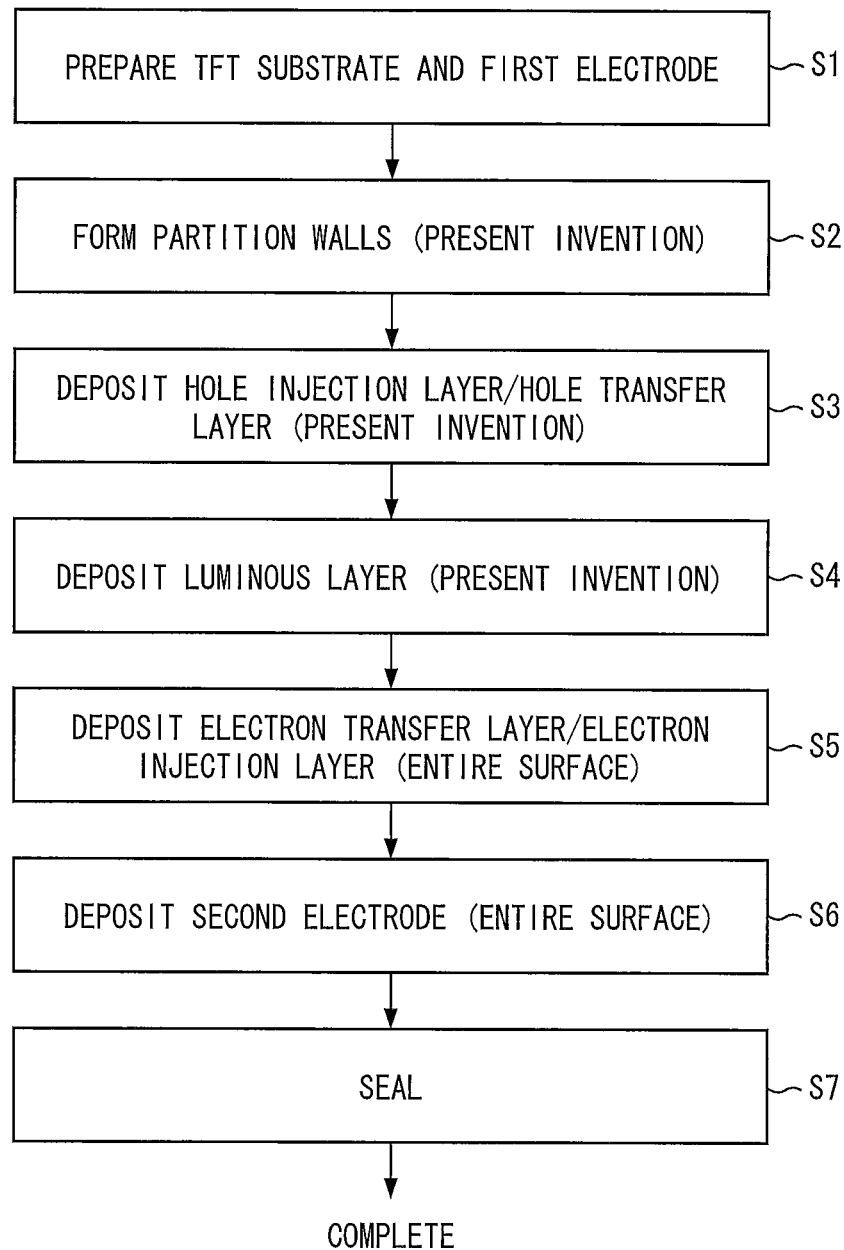

FIG. 10
(a)
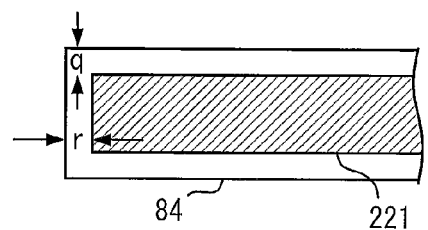
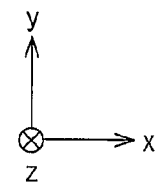
(b)
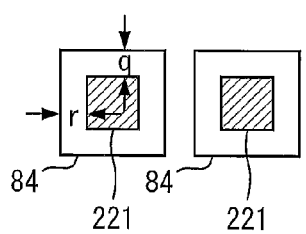
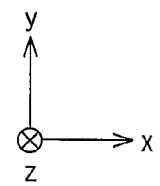
(c)
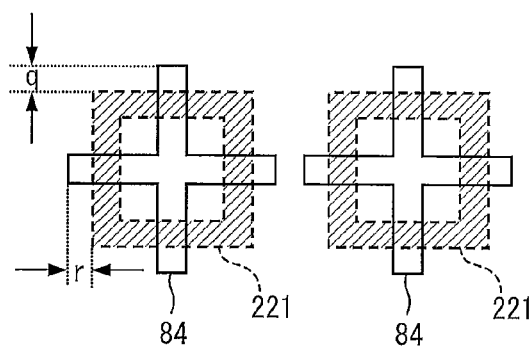
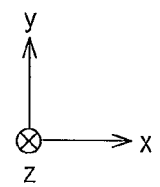

FIG. 11
(a)
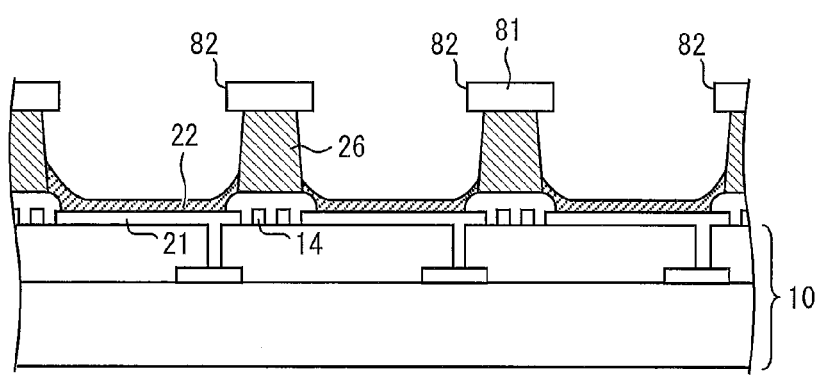
(b)
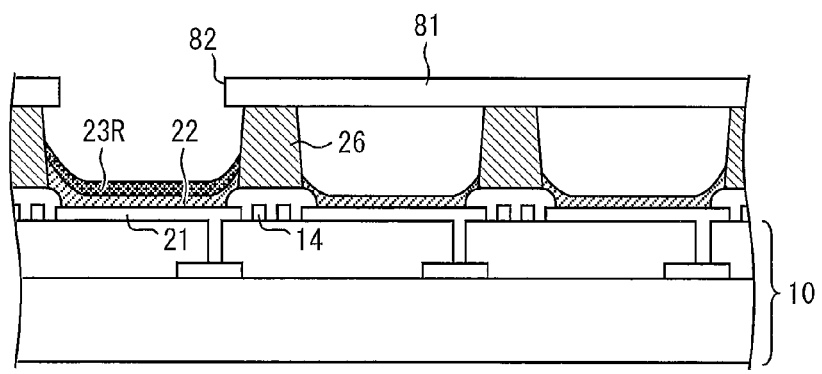

F I G. 1 5
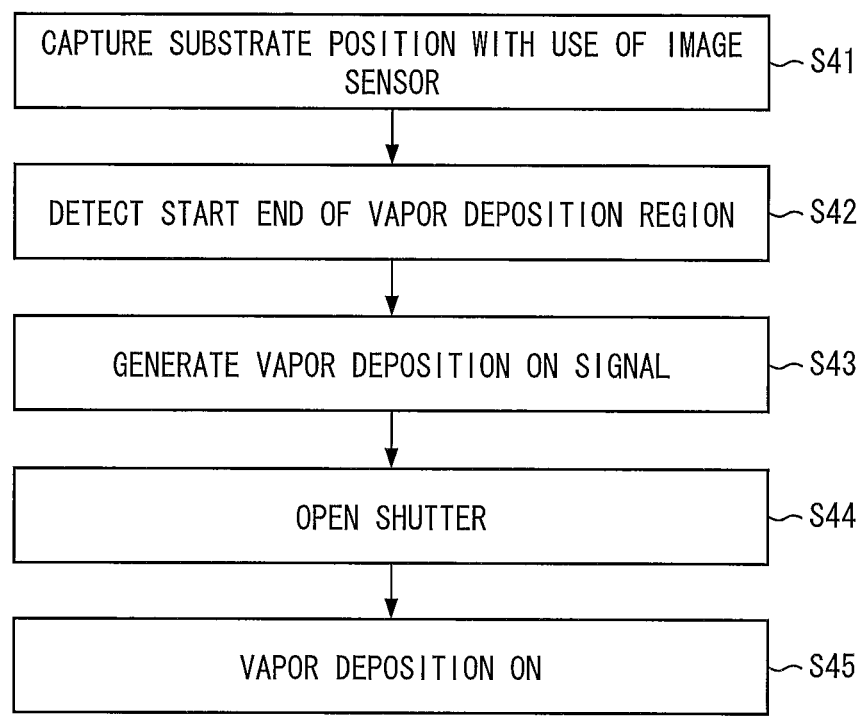

FIG. 16
(a)
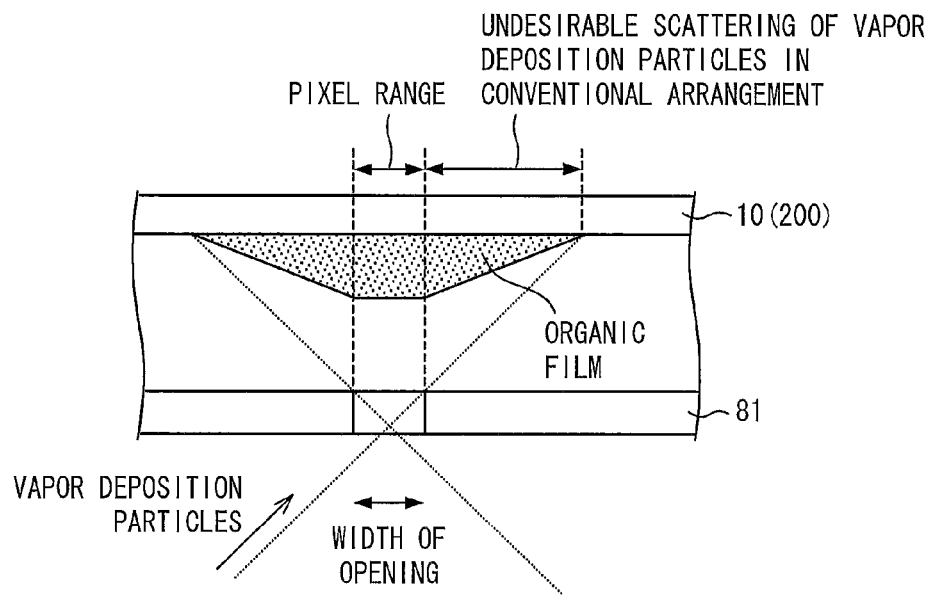
(b)
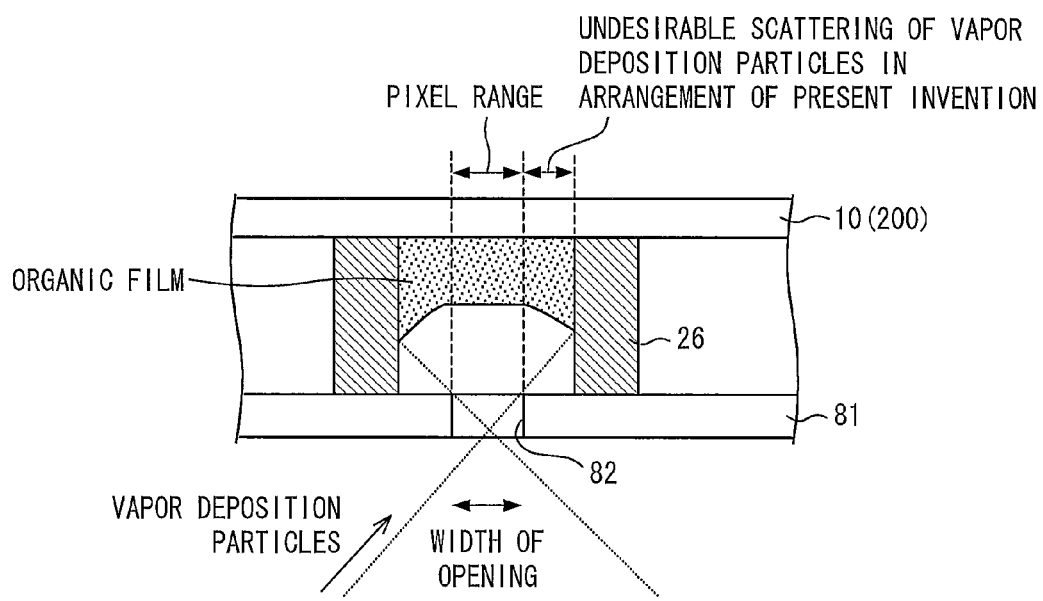

F I G. 1 7
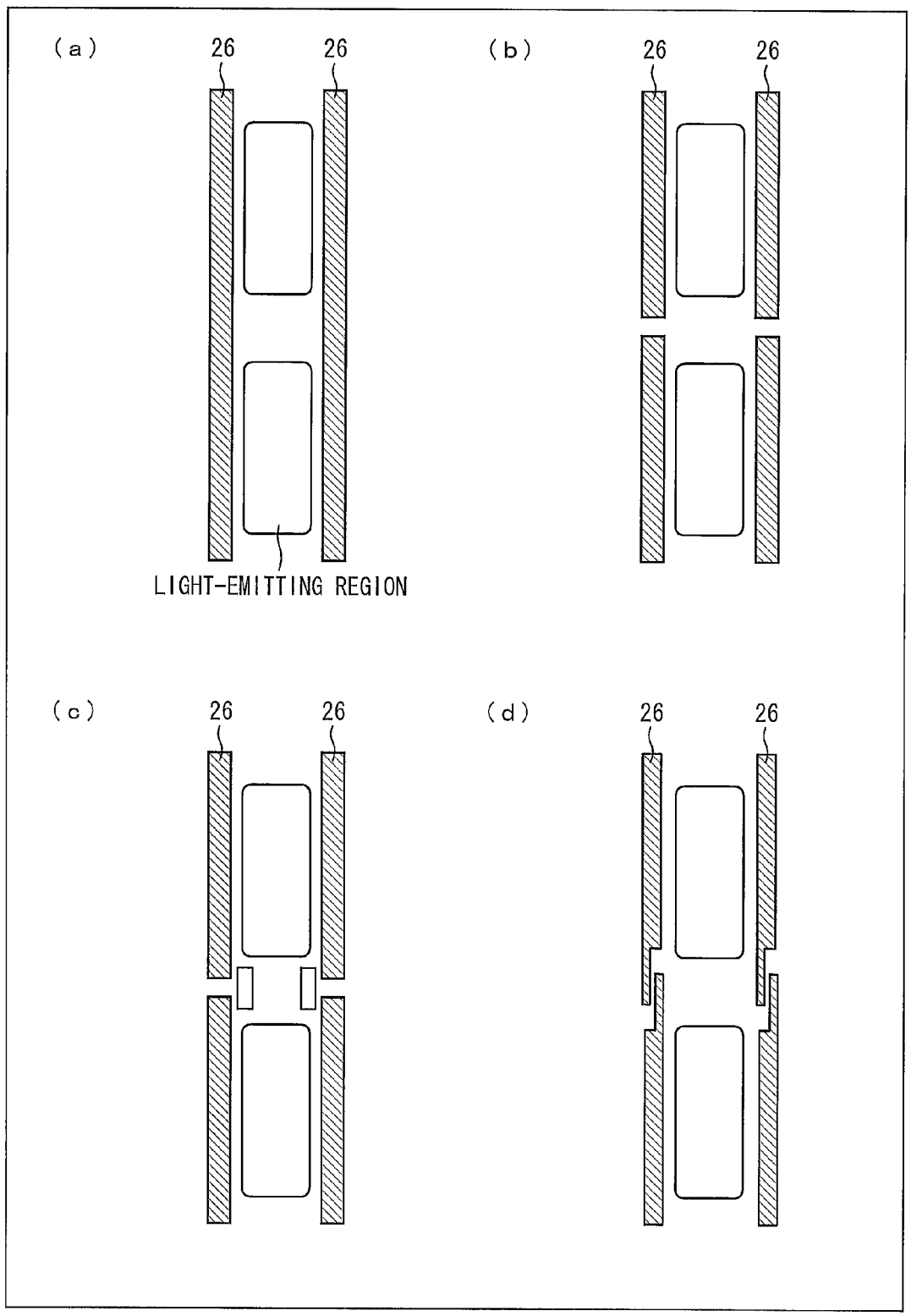

FIG. 18
(a)
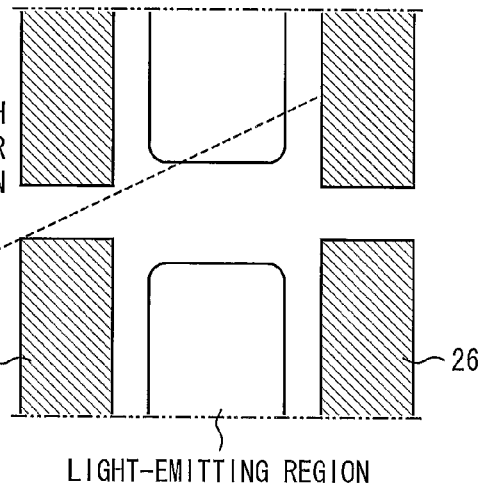
STRAIGHT LINE PASSING THROUGH
DISCONTINUOUS PORTION AND OVER
LIGHT-EMITTING REGION
26
LIGHT-EMITTING REGION
(b)
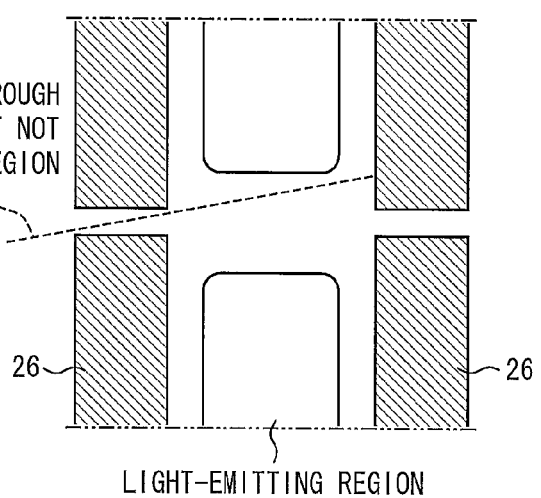
STRAIGHT LINE PASSING THROUGH
DISCONTINUOUS PORTION BUT NOT
OVER LIGHT-EMITTING REGION
26
LIGHT-EMITTING REGION FIG. 20
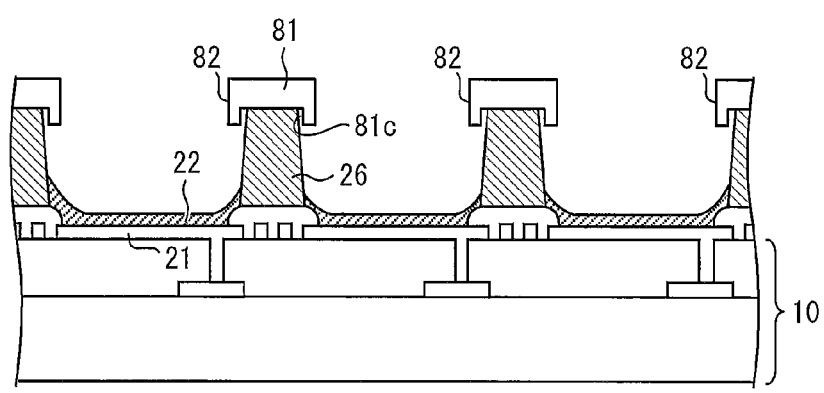
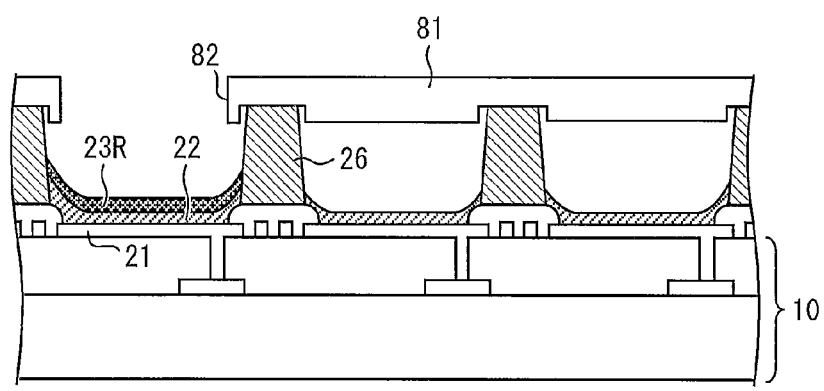

F I G. 2 1
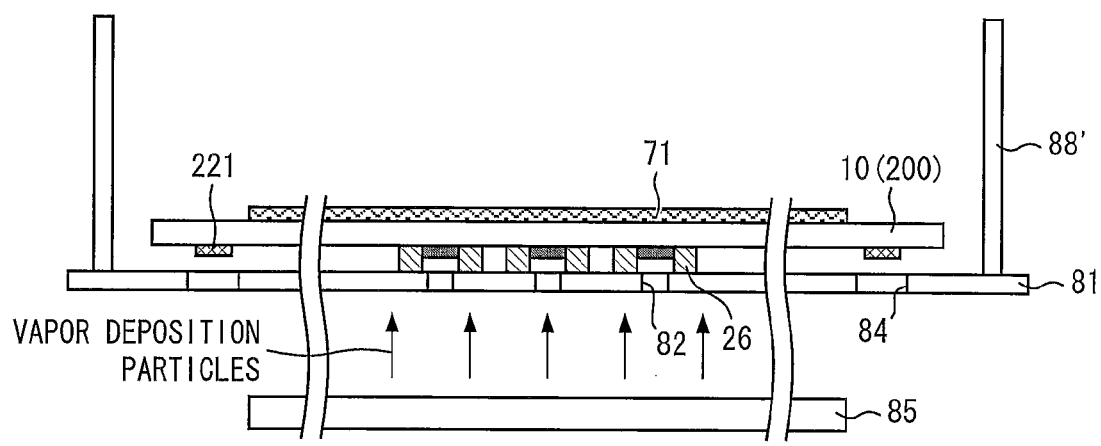

FIG. 22
(a)
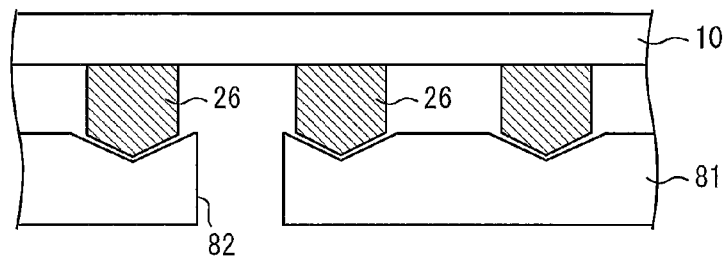
(b)
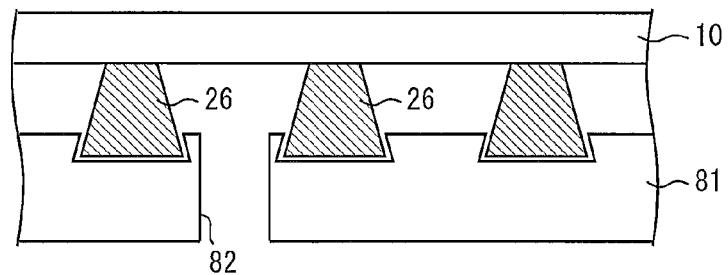
(c)
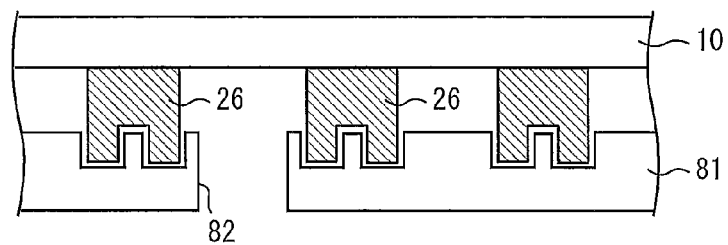

FIG. 23
(a)
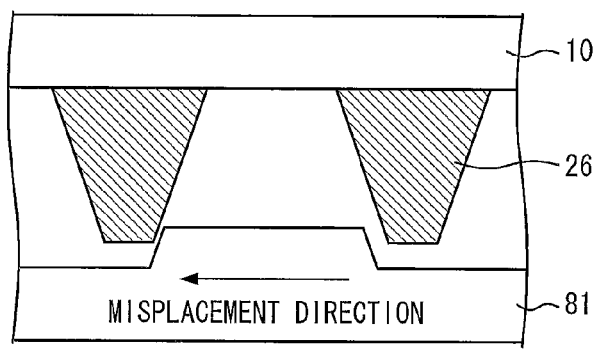
(b)
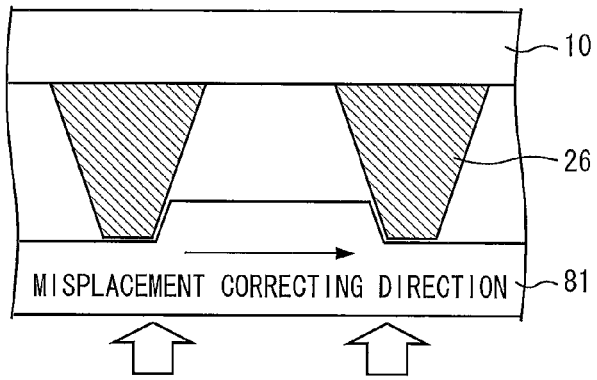

F I G. 2 5
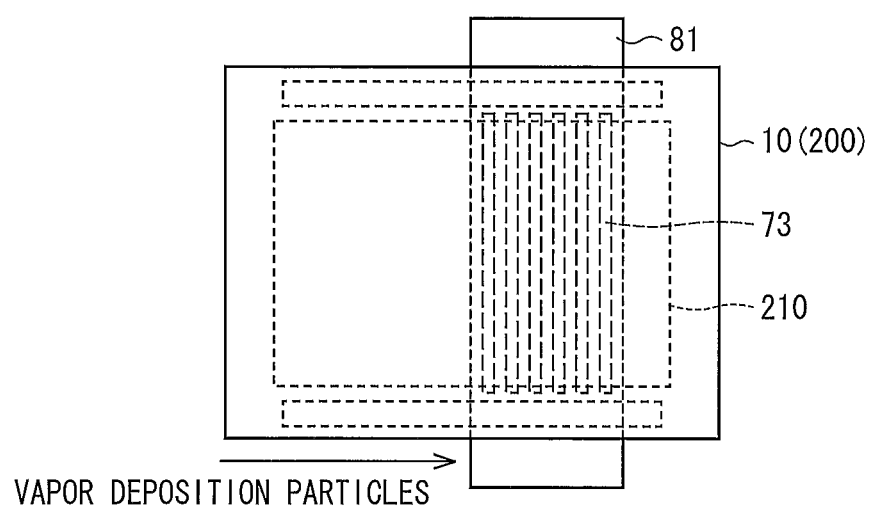

FIG. 26
(a)
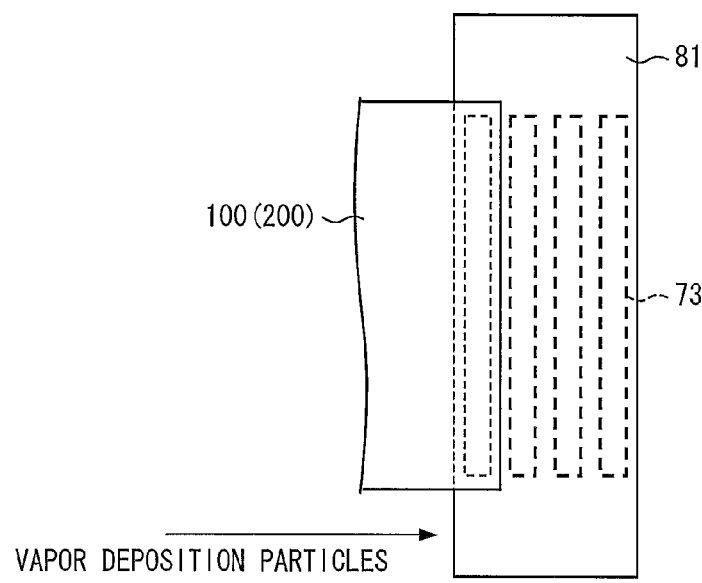
VAPOR DEPOSITION PARTICLES →
(b)
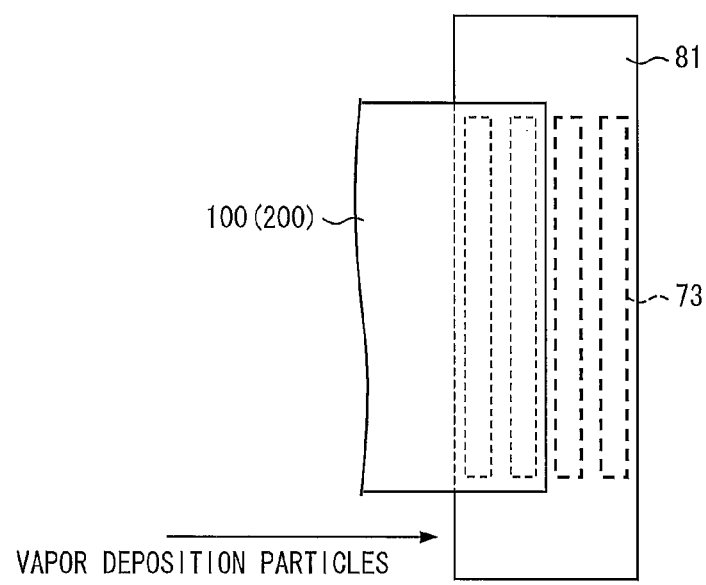
VAPOR DEPOSITION PARTICLES →

401 GLASS SUBSTRATE
402 METAL MASK
402a PATTERN
403 VAPOR DEPOSITION SOURCE
406 VAPOR DEPOSITION SUBSTANCE
408 PARTITION WALL

VAPOR DEPOSITION METHOD AND METHOD FOR PRODUCING AN ORGANIC ELECTROLUMINESCENCE DISPLAY DEVICE

CROSS REFERENCE TO RELATED APPLICATIONS

This is application is a divisional of U.S. patent application Ser. No. 13/879,761, filed internationally on Oct. 12, 2011, which is a U.S. National Phase patent application of PCT/JP2011/073426, filed Oct. 12, 2011, which claims priority to Japanese patent application no. 2010-234625, filed Oct. 19, 2010, each one of which is hereby incorporated by reference in the present disclosure in its entirety.

TECHNICAL FIELD

The present invention relates to (i) a vapor deposition device involving use of a vapor deposition mask, (ii) a vapor deposition method, and (iii) a method for producing an organic electroluminescent display device with use of the vapor deposition device and the vapor deposition method.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT. The organic EL layer between the first electrode and the second electrode is an organic layer including a stack of layers such as a hole injection layer, a hole transfer layer, an electron blocking layer, a luminous layer, a hole blocking layer, an electron transfer layer, and an electron injection layer.

A full-color organic EL display device typically includes organic EL elements of red (R), green (G), and blue (B) as sub-pixels aligned on a substrate. The full-color organic EL display device carries out an image display by, with use of TFTs, selectively causing the organic EL elements to each emit light with a desired luminance.

Such an organic EL display device is produced through a process that forms, for each organic EL element serving as a light-emitting element, a pattern of a luminous layer made of an organic luminescent material which emits light of at least the above three colors (see, for example, Patent Literatures 3 to 5).

Such formation of a luminous layer pattern is performed by a method such as (i) a vacuum vapor deposition method that uses a vapor deposition mask referred to as a shadow mask, (ii) an inkjet method, and (iii) a laser transfer method.

The production of, for example, a low-molecular organic EL display (OLED) has conventionally used a vapor deposition method involving a shadow mask, the vapor deposition method forming organic layers by discriminative application.

The vacuum vapor deposition method involving a shadow mask uses a shadow mask that is so sized as to allow vapor deposition to be performed over the entire vapor deposition region of a substrate. The vacuum vapor deposition method provides an opening in the shadow mask in the pattern of the vapor deposition region, and then fixes (for example, welds) the shadow mask to a mask frame under tension to prevent the mask from bending. The vacuum vapor deposition method next places the opening of the shadow mask in contact with a substrate at its partition wall, and causes vapor deposition particles from a vapor deposition source to be deposited (adhered) onto a desired position of the substrate through the opening of the shadow mask. This forms patterns of the luminous layer and the like.

FIG. 27 is a cross-sectional view schematically illustrating an example configuration of a conventional vapor deposition device involving the use of a shadow mask. The vacuum vapor deposition method involving a shadow mask, as illustrated in (a) of FIG. 27, forms a pattern by (i) placing a substrate 301 and a vapor deposition source 302 at such positions that the substrate 301 and the vapor deposition source 302 face each other, (ii) forming, in a shadow mask 303, openings 304 corresponding to a pattern of a portion of a target vapor deposition region so that no vapor deposition particles are adhered to a region other than the vapor deposition region, and (iii) depositing vapor deposition particles onto the substrate 301 through the openings 304.

The substrate 301 is placed in a vacuum chamber (not shown). The vapor deposition source 302 is fixed below the substrate 301. The shadow mask 303 is either fixed in close contact with the substrate 301 or moved relative to the substrate 301 while the substrate 301 and the vapor deposition source 302 are fixed to an inner wall of the vacuum chamber.

FIG. 28 is a cross-sectional view schematically illustrating another example configuration of a conventional vapor deposition device involving the use of a shadow mask. This vapor deposition device, as illustrated in FIG. 28, uses a metal mask 402 smaller in size than a substrate 401 to perform vapor deposition sequentially onto portions of the substrate 401 for formation of a pattern of a vapor deposition substance 406 throughout a surface of the substrate 401. Further, the above vapor deposition device includes a cylindrical partition wall 408 that surrounds a vapor deposition source 403 to confine the vapor deposition substance 406 from the vapor deposition source 403 in the space defined by the partition wall 408.

CITATION LIST

Patent Literature 1
Japanese Patent Application Publication, Tokukai, No. 2004-103341 A (Publication Date: Apr. 2, 2004)
Patent Literature 2
Japanese Patent Application Publication, Tokukai, No. 2000-96211 A (Publication Date: Apr. 4, 2000)
Patent Literature 3
Japanese Patent Application Publication, Tokukai, No. 2000-188179 A (Publication Date: Jul. 4, 2000); corresponding U.S. Pat. No. 6,294,892 (Publication Date: Sep. 25, 2001)
Patent Literature 4
Japanese Patent Application Publication, Tokukaihei, No. 8-227276 A (Publication Date: Sep. 3, 1996); corresponding U.S. Pat. No. 5,742,129 (Publication Date: Apr. 21, 1998)
Patent Literature 5
Japanese Patent Application Publication, Tokukaihei, No. 9-167684 A (Publication Date: Jun. 24, 1997); corresponding
U.S. Pat. No. 5,688,551 (Publication Date: Nov. 18, 1997)

SUMMARY OF INVENTION

Technical Problem

Unfortunately, a larger substrate size requires the shadow mask 303 to be larger in size as well.

Such a larger size results in, as illustrated in (b) of FIG. 27, a gap between the substrate 301 and the shadow mask 303 due to, for example, self-weight bending and elongation of the shadow mask 303. This makes it impossible to form a pattern with high positional accuracy, and thus causes, for example, misplacement in vapor deposition and color mixture, thereby making it difficult to achieve high resolution.

Further, a larger substrate size requires the shadow mask 303 and a mask frame that holds it to be both extremely large and heavy. This in turn requires a device that uses the shadow mask 303 to be extremely large and complex, which not only makes it difficult to design such a device, but also causes a safety problem in handling the shadow mask during a production step or a step such as replacing the shadow mask.

It is, in consequence, extremely difficult to form a pattern of a large-sized substrate with use of a large-sized shadow mask.

The configuration illustrated in FIG. 28 includes a mask smaller in size than a substrate. This configuration, in the case where the substrate has a film formation region larger than the mask, requires joining separate patterns. This gives rise to non-uniformity in film thickness at the joints, resulting in impaired display quality, or makes it impossible to produce an organic EL display device larger than a small-sized mask. The above case further requires, for each vapor deposition region, the sequential steps of moving the mask, aligning the mask with the substrate, and closely attaching the mask to the substrate. This increases tact time for the process. In addition, the above case further requires shielding the vapor deposition substance with use of a shutter or the like during each alignment with a portion of the substrate. This decreases material use efficiency.

A process of producing an organic EL display device requires a substrate size of approximately 1 m per side in order to use an existing mass production process of the vapor deposition method involving a full-cover contact type shadow mask. It is difficult to use the vapor deposition method for a large-sized substrate having a substrate size larger than approximately 1 m per side. This indicates that there currently exists no established organic layer discriminative application technique that is usable for a large-sized substrate. It is thus impossible to mass-produce a large-sized organic EL display device of a 60-inch class or a larger size.

Further, pattern formation based on the inkjet method causes, for example, color mixture between adjacent sub-pixels because of finer patterns, and only has a limited patterning accuracy in, for example, controlling a liquid drop position.

The inkjet method typically uses an organic luminescent material made of a high molecule. Such a high-molecular luminescent material is, however, difficult to develop in some respects, and is at present problematically inferior in light emission property and life to a low-molecular luminescent material.

The inkjet method additionally requires a particular arrangement so that no foundation layer will dissolve in a solvent of a material used to form an upper layer. The inkjet method thus does not make it possible to use an arbitrary foundation layer.

The inkjet method also requires a long tact time for formation of a pattern on a large-sized substrate because of an increased number of ejected droplets and an expansion of an ejection range. Further, the inkjet method causes a large variation in film thickness and film flatness, depending on how well a solvent of the ejected liquid is dried. The inkjet method thus tends to result in display irregularity occurring in a display device produced.

The laser transfer method involving a source of light such as laser light uses (i) a donor substrate including a light-heat converting layer and an organic donor layer and (ii) a film formation substrate on which the film is to be formed, the film formation substrate including, for example, first electrodes and sub-pixels, the donor substrate and the film formation substrate being placed so that the organic donor layer of the donor substrate faces the electrodes and the like of the film formation substrate. Irradiating the light-heat converting layer of the donor substrate with laser light causes the light-heat converting layer to absorb optical energy and convert it into heat. Scanning a desired region with the laser light during the irradiation causes the organic donor layer to vaporize in a corresponding region, which forms a pattern of an organic layer on the film formation substrate. The laser transfer method thus makes it possible to selectively transfer a luminous layer to regions corresponding respectively to the first electrodes.

The laser transfer method, however, requires laser scanning to be performed as many times as the number of sub-pixel lines, and thus requires a long tact time.

The laser transfer method causes a formed film to be non-uniform in film thickness when having problems with, for example, (i) stability of a laser light source and/or (ii) non-uniformity in beam profile due to, for example, deflection arising from mechanical scanning and/or a change in focal length. This leads to display irregularity occurring in a resulting display device produced. The laser transfer method thus poses a lot of problems in handling a larger size substrate and in mass production.

As described above, none of the existing pattern formation methods will facilitate forming a pattern of an organic layer on a large-sized substrate, particularly an eighth-generation substrate (approximately 2,160 mm×2,460 mm) or newer. Further, the above pattern formation methods all pose a problem in mass production.

As described above, there has been known no production technique or production device that allows a pattern of an organic layer to be formed on a large-sized substrate. The constraint in substrate size has prevented production of a large-sized organic EL display device.

A larger substrate size normally allows a larger number of panels to be formed from a single substrate, and thus reduces the unit cost of a panel. This means that a larger sized substrate allows an organic EL display device to be produced at a lower cost. Conventionally, however, the above constraint in substrate size has prevented production of a low-cost organic EL display device.

The present invention has been accomplished in view of the above problem. It is an object of the present invention to provide (i) a vapor deposition method and a vapor deposition device each of which makes it possible to form a vapor deposition pattern on a large-sized substrate and (ii) a method for producing an organic EL display device which method uses the vapor deposition method or the vapor deposition device.

Solution to Problem

In order to solve the above problem, a vapor deposition device of the present invention for forming, on a film formation substrate on which the film is to be formed, a film having a predetermined pattern, the film formation substrate having a partition wall that has a predetermined height and that stands between film formation regions on the film formation substrate, the vapor deposition device includes: a mask unit provided so as to face the film formation substrate and so as to include: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other; contacting means for bringing the film formation substrate and the vapor deposition mask into contact with each other at the partition wall; and moving means for moving at least a first one of the mask unit and the film formation substrate relative to a second one thereof in a state in which the vapor deposition mask and the film formation substrate are in contact with each other at the partition wall.

In order to solve the above problem, a vapor deposition method of the present invention for forming, on a film formation substrate on which the film is to be formed, a film having a predetermined pattern includes: a partition wall forming step of forming, on the film formation substrate, a partition wall having a predetermined height and standing between film formation regions on the film formation substrate; a contacting step of (i) preparing a mask unit including: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other, and (ii) bringing the vapor deposition mask and the film formation substrate into contact with each other at the partition wall; and a vapor deposition step of (i) moving at least a first one of the mask unit and the film formation substrate relative to a second one thereof in a state in which the vapor deposition mask and the film formation substrate are in contact with each other at the partition wall and (ii) sequentially depositing the vapor deposition particle onto the vapor deposition region of the film formation substrate through the opening of the vapor deposition mask.

The vapor deposition device and vapor deposition method above are each different from conventional art in that the vapor deposition mask and the film formation substrate are not fixed to each other and that the vapor deposition mask and the vapor deposition source are fixed in position relative to each other. This makes it possible to carry out vapor deposition by (i) using, as described above, a vapor deposition mask smaller in area than the vapor deposition region of the film formation substrate and (ii) moving at least a first one of the mask unit and the film formation substrate relative to a second one thereof.

Further, a partition wall having a predetermined height is provided to stand between film formation regions on the film formation substrate, and the vapor deposition mask and the film formation substrate are brought into contact with each other at the partition wall by the contacting means.

The arrangements above each thus prevent the problem of, for example, self-weight bending and elongation due to a large-sized vapor deposition mask, and consequently make it possible to not only form a pattern of an organic layer on a large-sized substrate, but also form such a pattern with high positional accuracy and high resolution. The arrangements above each prevent the film formation substrate from coming into direct contact with the vapor deposition mask, and thus prevent the vapor deposition mask from damaging the film formation substrate. The arrangements above, each further including a partition wall having a predetermined height and standing between film formation regions on the film formation substrate, prevent vapor deposition particles from being scattered to an adjacent film formation region during vapor deposition, and can thus reliably prevent vapor deposition particles from being undesirable scattered to an adjacent pixel to cause color mixture or property impairment.

The arrangements above can each carry out vapor deposition by moving at least a first one of the mask unit and the film formation substrate relative to a second one thereof while there is a fixed partition wall between the mask unit and the film formation substrate, and thus form a film formation pattern (vapor deposition film) that is uniform in width and film thickness.

The vapor deposition device and the vapor deposition method above each use a vapor deposition mask smaller in area than the vapor deposition region of the film formation substrate as described above. This can reduce or prevent problems caused by a frame for holding a vapor deposition mask which frame is extremely large and extremely heavy due to a large-sized vapor deposition mask.

The above predetermined pattern can be of an organic layer for an organic electroluminescent device. The above vapor deposition method is suitably applicable to production of an organic electroluminescent device.

In order to solve the above problem, a method of the present invention for producing an organic electroluminescent display device includes the steps of: (a) preparing a TFT substrate on which a first electrode is provided; (b) depositing, on the TFT substrate, an organic layer including at least a luminous layer; (c) depositing a second electrode having a polarity reversed with respect to a polarity of the first electrode; and (d) sealing, with use of a sealing member, an organic electroluminescent device including the organic layer and the second electrode, the step (b) includes the partition wall forming step, the contacting step, and the vapor deposition step all included in the vapor deposition method above.

The above arrangement makes it possible to not only form a pattern of an organic layer on a large-sized substrate, but also produce an organic electroluminescent display device that forms such a pattern with high positional accuracy and high resolution.

Advantageous Effects of Invention

The present invention is different from conventional art in that the vapor deposition mask and the film formation substrate are not fixed to each other and that the vapor deposition mask and the vapor deposition source are fixed in position relative to each other. This makes it possible to carry out vapor deposition by (i) using, as described above, a vapor deposition mask smaller in area than the vapor deposition region of the film formation substrate and (ii) moving at least a first one of the mask unit and the film formation substrate relative to a second one thereof. The present invention thus prevents the problem of, for example, self-weight bending and elongation due to a large-sized vapor deposition mask, and consequently makes it possible to not only form a pattern of an organic layer on a large-sized substrate, but also form such a pattern with high positional accuracy and high resolution.

Further, a partition wall having a predetermined height is provided to stand between film formation regions on the film formation substrate, and the vapor deposition mask and the film formation substrate are brought into contact with each other at the partition wall by the contacting means. The present invention thus prevents the film formation substrate from coming into direct contact with the vapor deposition mask, and prevents the vapor deposition mask from damaging the film formation substrate. The present invention, which further includes a partition wall having a predetermined height and standing between film formation regions on the film formation substrate, prevents vapor deposition particles from being scattered to an adjacent film formation region during vapor deposition, and can thus reliably prevent vapor deposition particles from being undesirable scattered to an adjacent pixel to cause color mixture or property impairment.

The present invention can carry out vapor deposition by moving at least a first one of the mask unit and the film formation substrate relative to a second one thereof while there is a fixed partition wall between the mask unit and the film formation substrate, and thus form a film formation pattern (vapor deposition film) that is uniform in width and film thickness.

The present invention uses a vapor deposition mask smaller in area than the vapor deposition region of the film formation substrate as described above. This can reduce or prevent problems caused by a frame for holding a vapor deposition mask which frame is extremely large and extremely heavy due to a large-sized vapor deposition mask.

BRIEF DESCRIPTION OF DRAWINGS

FIG. 1 is a cross-sectional view schematically illustrating a configuration of a main part of the vapor deposition device according to an embodiment of the present invention.

FIG. 2

(a) is a cross-sectional view illustrating an example configuration of a portion E illustrated in FIG. 1, and (b) is a cross-sectional view illustrating another example configuration of the portion E illustrated in FIG. 1.

FIG. 3 is a cross-sectional view schematically illustrating a configuration of an organic EL display device for carrying out an RGB full color display.

Figure 4:
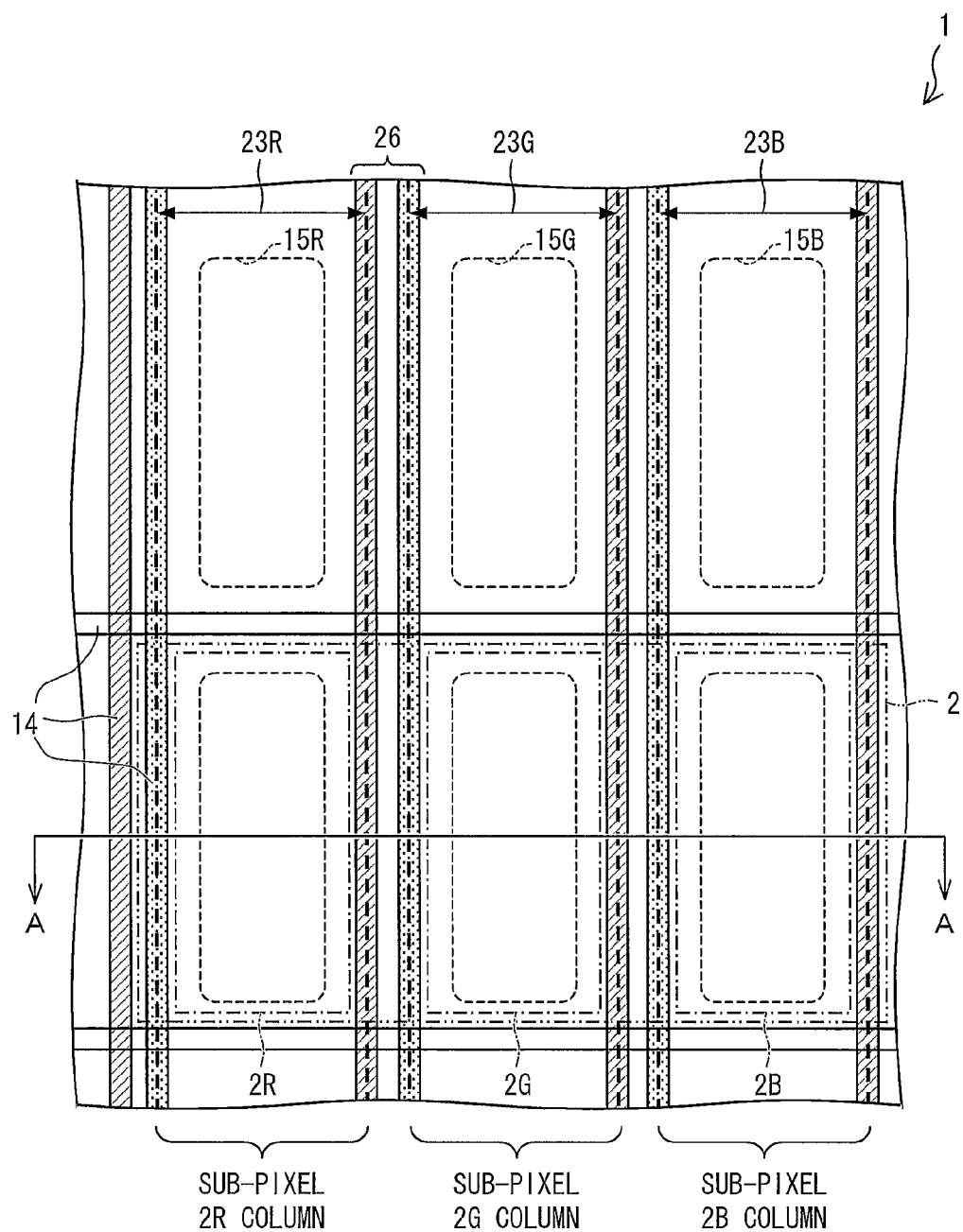

FIG. 4 is a plan view illustrating an arrangement of pixels constituting the organic EL display device illustrated in FIG. 3.

Figure 5:
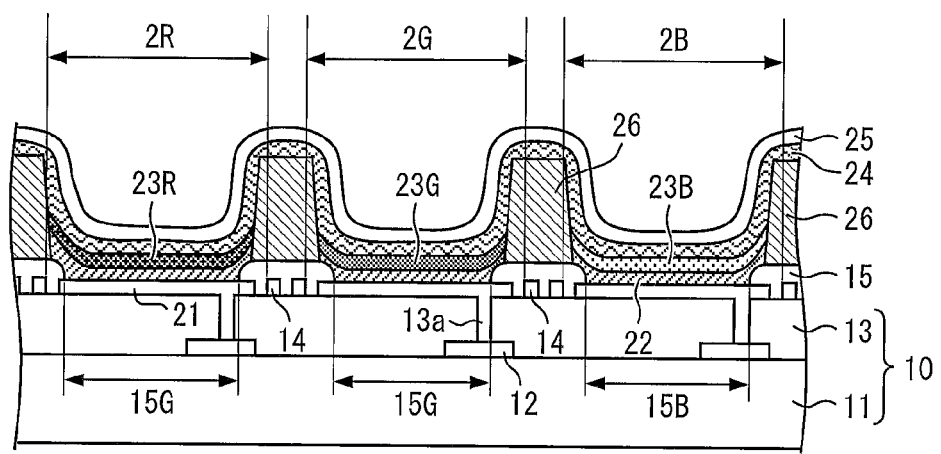

FIG. 5 is a cross-sectional view, taken along line A-A, illustrating a film formation substrate in the organic EL display device illustrated in FIG. 4.

FIG. 6 is a flowchart indicating successive steps for producing the organic EL display device according to an embodiment of the present invention.

Figure 7:
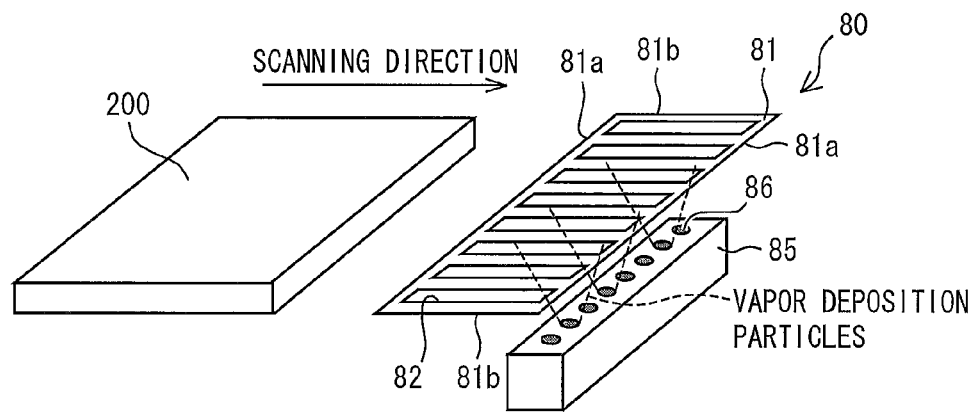

FIG. 7 is a bird's eye view illustrating main constituent elements inside the vacuum chamber of the vapor deposition device according to an embodiment of the present invention.

Figure 8:
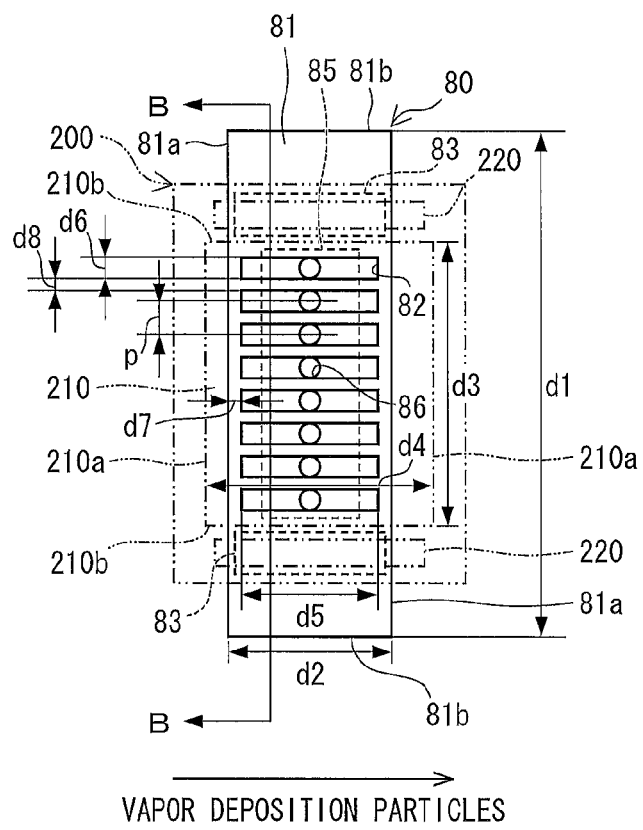

FIG. 8 is a plan view illustrating a film formation substrate and a mask unit inside a vacuum chamber of a vapor deposition device according to an embodiment of the present invention, the plan view being taken from a back surface side of the film formation substrate.

Figure 9:
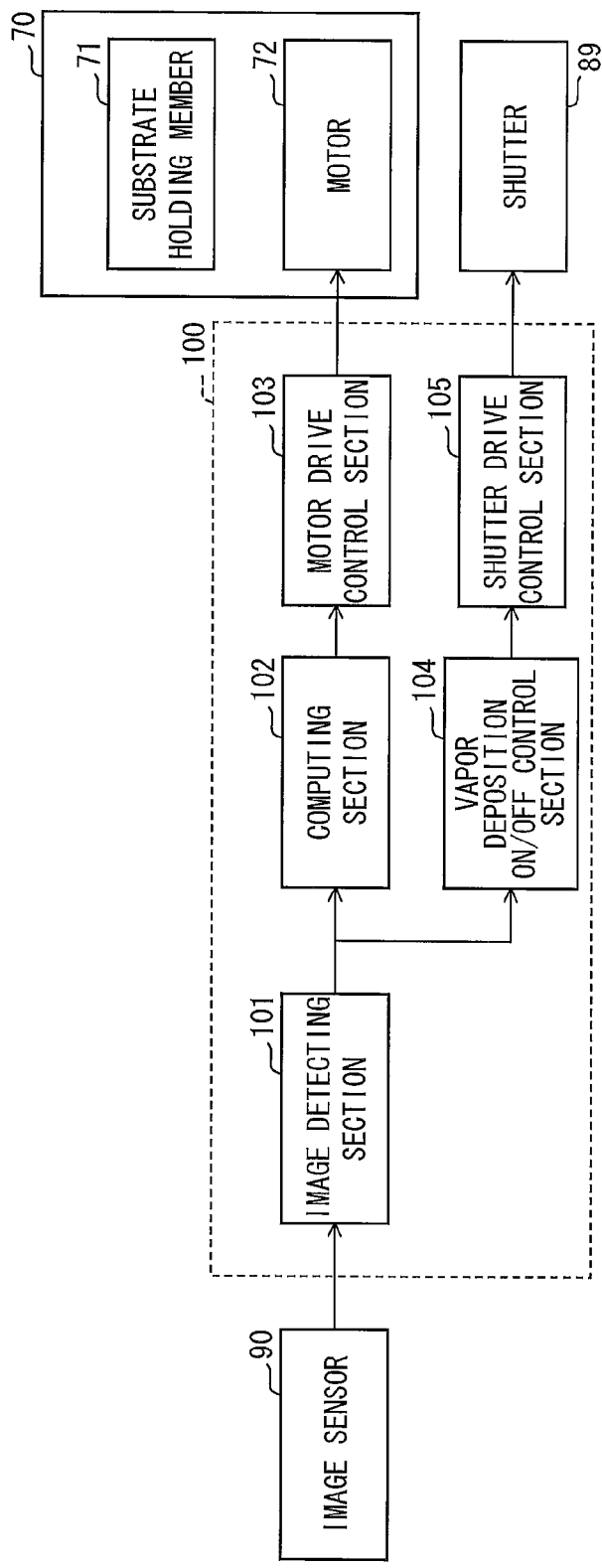

FIG. 9 is a block diagram partially illustrating a configuration of the vapor deposition device according to an embodiment of the present invention.

FIG. 10

(a) through (c) are each a diagram illustrating example shapes of alignment markers provided to the film formation substrate and a vapor deposition mask according to an embodiment of the present invention.

FIG. 11

(a) and (b) are each a cross-sectional view illustrating an arrangement of a vapor deposition device of an embodiment of the present invention for patterning an organic EL layer on a substrate.

Figure 12:
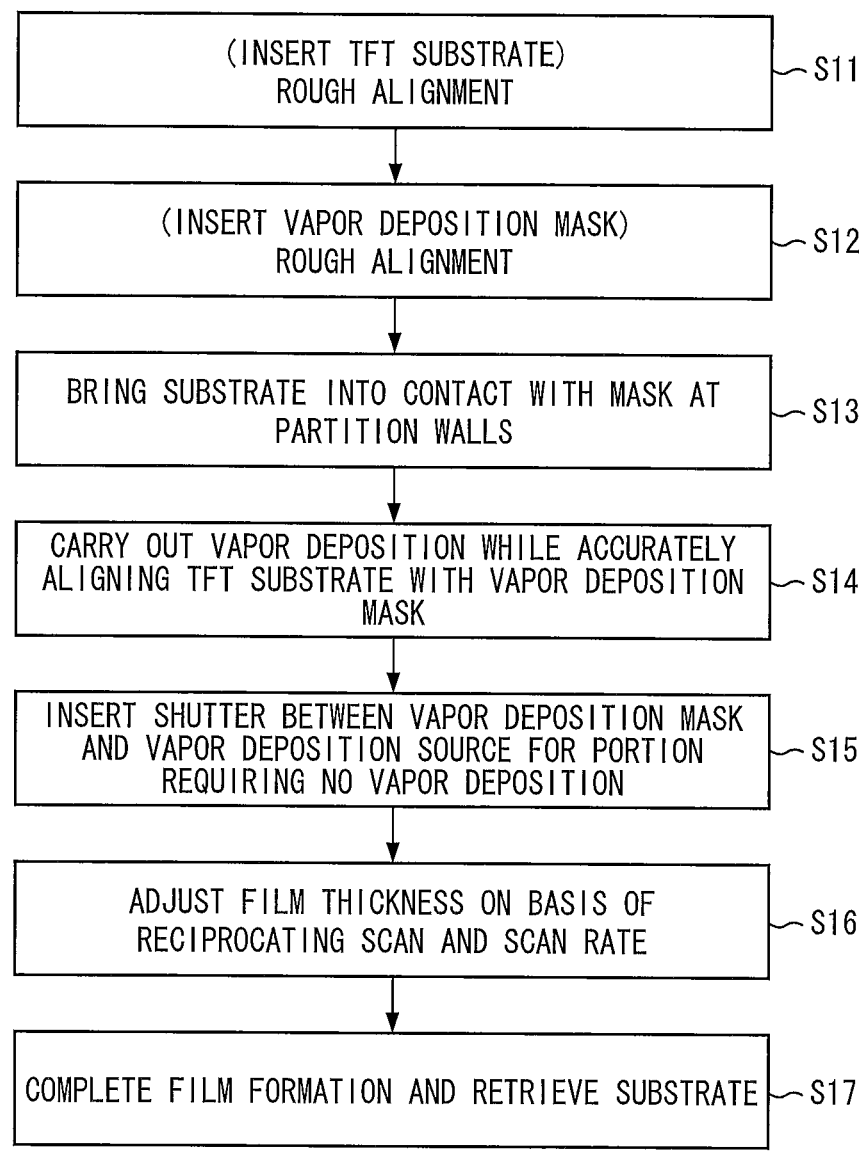

FIG. 12 is a flowchart indicating an example method for forming a predetermined pattern on a TFT substrate with use of the vapor deposition device according to an embodiment of the present invention.

Figure 13:
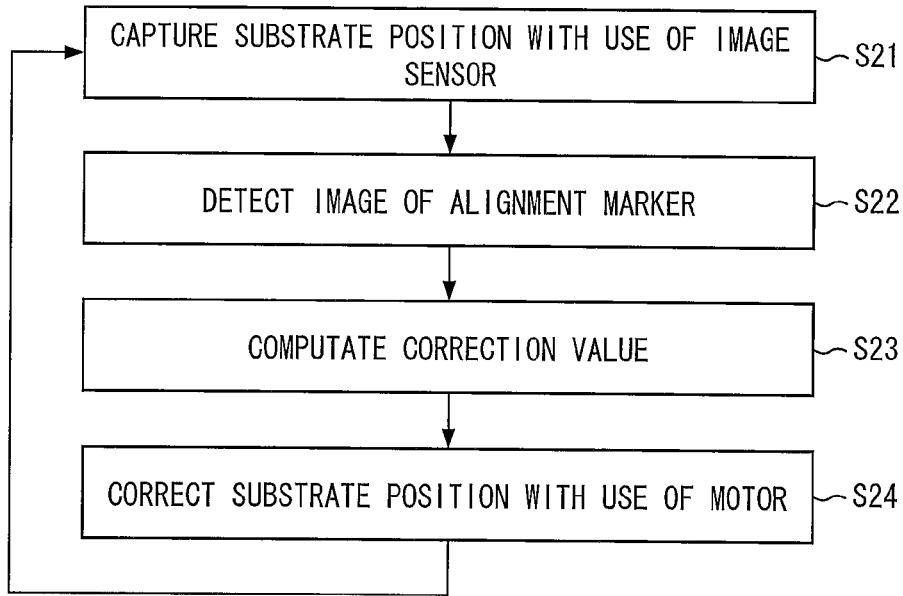

FIG. 13 is a flowchart indicating an alignment adjustment method.

Figure 14:
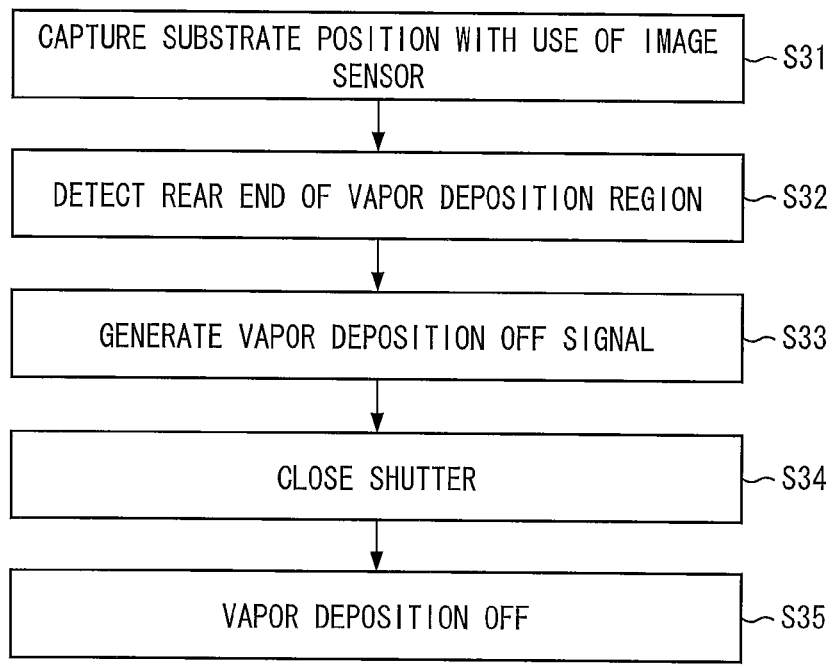

FIG. 14 is a flowchart indicating a flow of a vapor deposition control carried out when vapor deposition is turned OFF.

FIG. 15 is a flowchart indicating a flow of a vapor deposition control carried out when vapor deposition is turned ON.

FIG. 16 is a configuration diagram for comparing a vapor deposition effect of a vapor deposition device of an embodiment of the present invention with a vapor deposition effect of a conventional vapor deposition device.

FIG. 17

(a) through (d) are each a plan view schematically illustrating an example arrangement of partition walls in a vapor deposition device of an embodiment of the present invention.

FIG. 18

(a) and (b) are each a plan view illustrating a relationship between a discontinuous portion of a partition wall and a light-emitting region in a vapor deposition device of an embodiment of the present invention.

Figure 19:
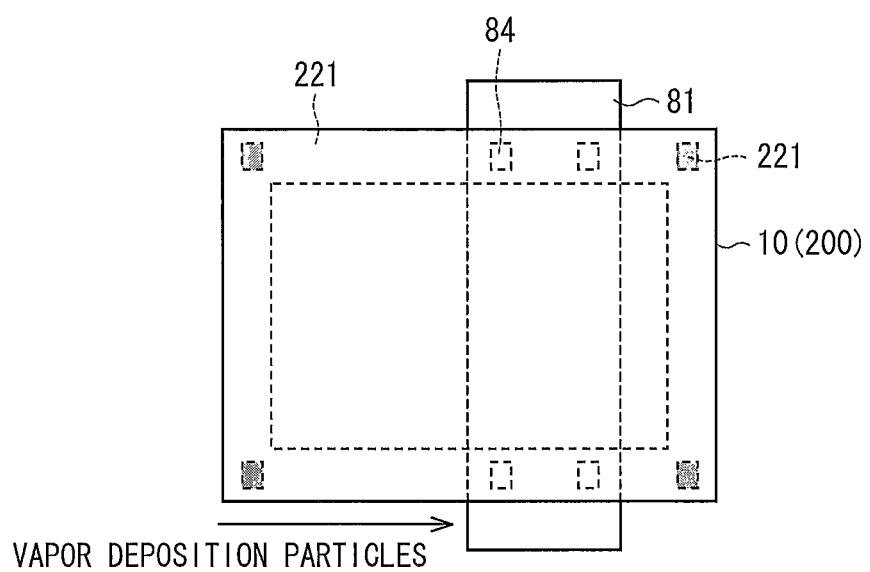

FIG. 19 is a diagram schematically illustrating another example arrangement of alignment markers in a vapor deposition device of another embodiment of the present invention.

FIG. 20

(a) and (b) are each a cross-sectional view illustrating an arrangement of a vapor deposition device of another embodiment of the present invention for patterning an organic EL layer on a substrate.

FIG. 21 is a cross-sectional view schematically illustrating a configuration of a main part inside the vacuum chamber of the vapor deposition device according to another embodiment of the present invention.

FIG. 22 is a cross-sectional view illustrating example configurations of partition walls in a vapor deposition device of another embodiment of the present invention.

FIG. 23

(a) and (b) are each a cross-sectional view illustrating correct of misplacement of a vapor deposition mask with use of partition walls in a vapor deposition device of another embodiment of the present invention.

FIG. 24

(a) is a diagram schematically illustrating a film formation substrate and a vapor deposition mask in a vapor deposition device of still another embodiment of the present invention, and (b) is a cross-sectional view taken along line C-C in (a).

FIG. 25 is a diagram schematically illustrating a film formation substrate and a vapor deposition mask in a vapor deposition device of yet another embodiment of the present invention.

FIG. 26

(a) and (b) are each a diagram schematically illustrating an operation relationship between the film formation substrate and the vapor deposition mask illustrated in FIG. 25

FIG. 27

(a) is a cross-sectional view schematically illustrating a configuration of a conventional vapor deposition device involving use of a shadow mask, and (b) is a diagram schematically illustrating a problem with the conventional vapor deposition device illustrated in (a).

Figure 28:
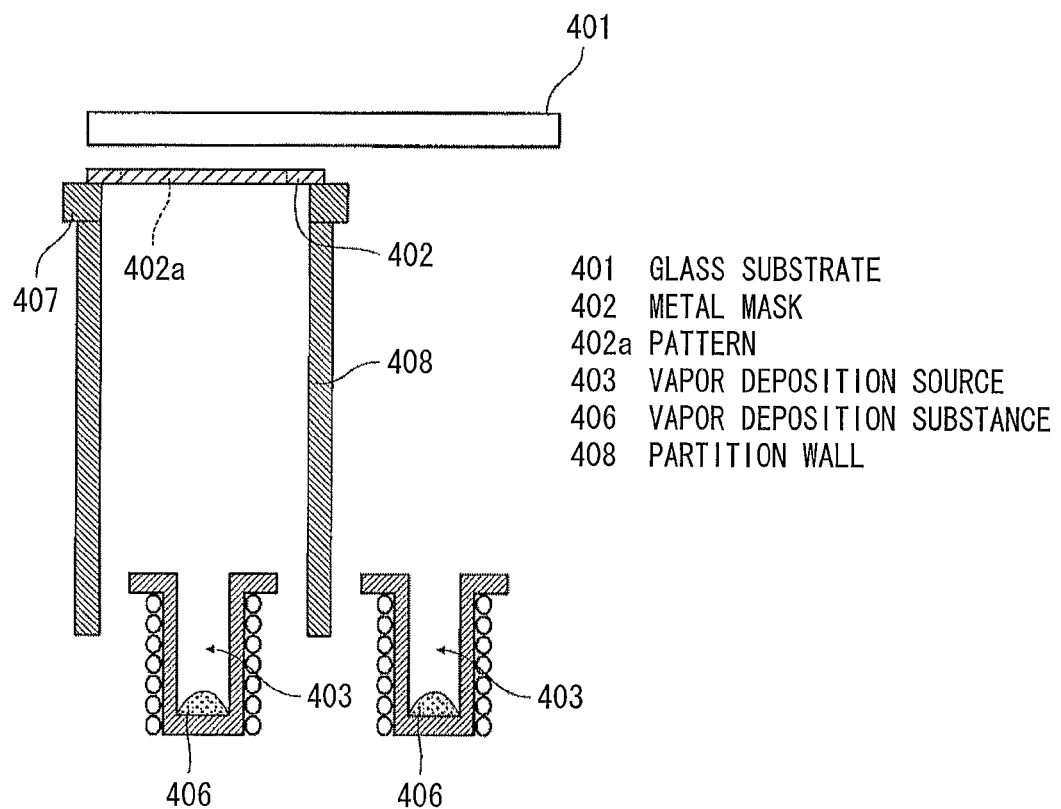

FIG. 28 is a cross-sectional view illustrating a conventional vapor deposition method.

DESCRIPTION OF EMBODIMENTS

The description below deals in detail with embodiments of the present invention.

Embodiment 1

An embodiment of the present invention is described below with reference to FIGS. 1 through 18.

The present embodiment describes, as an example vapor deposition method involving a vapor deposition device of the present embodiment, a method for producing an organic EL display device that (i) is of a bottom emission type, that is, extracts light from a TFT substrate (film formation substrate) side, and that (ii) carries out an RGB full color display.

The description first deals with the overall configuration of the organic EL display device.

FIG. 3 is a cross-sectional view schematically illustrating a configuration of the organic EL display device that carries out an RGB full color display. FIG. 4 is a plan view illustrating an arrangement of pixels included in the organic EL display device illustrated in FIG. 3. FIG. 5 is a cross-sectional view, taken long line A-A in FIG. 4, of a TFT substrate included in the organic EL display device illustrated in FIG. 4.

As illustrated in FIG. 3, the organic EL display device 1 produced in the present embodiment includes: a TFT substrate 10 including TFTs 12 arranged in a matrix (see FIG. 5); an organic EL element 20 provided on the TFT substrate 10 and connected to the TFTs 12; an adhesive layer 30; and a sealing substrate 40, arranged in that order.

The organic EL element 20 is contained between the TFT substrate 10 and the sealing substrate 40 by attaching the TFT substrate 10, on which the organic EL element 20 is provided, to the sealing substrate 40 with use of the adhesive layer 30. This arrangement prevents infiltration of oxygen, moisture and the like present outside into the organic EL element 20.

As illustrated in FIG. 5, the TFT substrate 10 includes, as a supporting substrate, a transparent insulating substrate 11 such as a glass substrate. The insulating substrate 11 is, as illustrated in FIG. 4, provided with a plurality of wires 14 including (i) a plurality of gate lines laid in the horizontal direction and (ii) a plurality of signal lines laid in the vertical direction and intersecting with the gate lines.

The organic EL display device 1 is a full-color, active matrix organic EL display device. The organic EL display device 1 includes, on the insulating substrate 11 and in regions defined by the wires 14, sub-pixels 2R, 2G, and 2B arranged in a matrix which include organic EL elements 20 of red (R), green (G), and blue (B), respectively.

In other words, the regions defined by the wires 14 each (i) correspond to a single sub-pixel (dot) and (ii) provide a light-emitting region of R, G, or B for such a single sub-pixel.

A pixel 2 (that is, a single pixel) includes three sub-pixels: a red sub-pixel 2R transmitting red (R) light; a green sub-pixel 2G transmitting green (G) light; and a blue sub-pixel 2B transmitting blue (B) light (the sub-pixels 2R, 2G, and 2B are referred to collectively as "sub-pixel 2").

The sub-pixels 2R, 2G, and 2B include, as light-emitting regions of the respective colors which light-emitting regions perform light emission of the respective sub-pixels 2R, 2G, and 2B, opening regions 15R, 15G, and 15B that are covered respectively by stripe-shaped luminous layers 23R, 23G, and 23B (referred to collectively as "luminous layer 23") of the respective colors. The luminous layers 23R, 23G, and 23B are each formed in a pattern and color by vapor deposition.

The stripe-shaped luminous layers 23 are each disposed in a space defined by partition walls 26 (see FIG. 4) each provided between columns of sub-pixels 2. The partition walls 26 will be detailed later in terms of, for example, where it is disposed and what shape it has.

The description below deals with the TFT substrate 10 of the present embodiment with reference to FIG. 5.

The TFT substrate 10, as illustrated in FIG. 5, includes on the transparent insulating substrate 11 such as a glass substrate: TFTs 12 (switching elements); an interlayer film 13 (interlayer insulating film, planarizing film); wires 14; an edge cover 15; and partition walls 26, formed in that order.

The insulating substrate 11 is provided thereon with TFTs 12 corresponding to the respective sub-pixels 2R, 2G, and 2B. Since the configuration of a TFT has conventionally been well-known, the individual layers of a TFT 12 are not illustrated in the drawings or described herein.

The interlayer film 13 is provided on the insulating substrate 11 over the entire region of the insulating substrate 11 to cover the TFTs 12. There are provided on the interlayer film 13 wires 14 and a first electrode 21 of the organic EL element 20.

The interlayer film 13 has contact holes 13a for electrically connecting the first electrode 21 of the organic EL element 20 to the TFTs 12. This electrically connects the TFTs 12 to the organic EL element 20 via the contact holes 13a.

The edge cover 15 is an insulating layer so formed as to cover edge sections of the pattern of the first electrode 21. The edge cover 15 serves to prevent a short circuit occurring between the first electrode 21 and a second electrode 25 due to (i) a reduced thickness of the organic EL layer in an edge section of the pattern of the first electrode 21 or (ii) an electric field concentration.

The edge cover 15 has opening regions 15R, 15G, and 15B for the sub-pixels 2R, 2G, and 2B, respectively. The opening regions 15R, 15G, and 15B of the edge cover 15 define the respective light-emitting regions of the sub-pixels 2R, 2G, and 2B.

The sub-pixels 2R, 2G, and 2B are, in other words, isolated from one another by the insulating edge cover 15. The edge cover 15 thus functions as an element isolation film as well.

The description below now deals with the organic EL element 20.

The organic EL element 20 is a light-emitting element capable of high-luminance light emission based on low-voltage direct-current driving, and includes: a first electrode 21; an organic EL layer; and a second electrode 25, stacked in that order.

The first electrode 21 is a layer having the function of injecting (supplying) positive holes into the organic EL layer. The first electrode 21 is, as described above, connected to the TFTs 12 via the contact holes 13a.

The organic EL layer provided between the first electrode 21 and the second electrode 25 includes, as illustrated in FIG. 5: a hole injection layer/hole transfer layer 22; a luminous layer 23; and an electron transfer layer/electron injection layer 24, formed in that order from the first electrode 21 side.

The hole injection layer/hole transfer layer 22 is a layer having the function of increasing efficiency in injecting and transporting positive holes into the luminous layer 23. The hole injection layer/hole transfer layer 22 is so formed uniformly over a display region of the TFT substrate 10 as to cover the first electrode 21 and a portion of the edge cover 15.

The luminous layer 23 is a layer having the function of emitting light by recombining (i) holes (positive holes) injected from the first electrode 21 side with (ii) electrons injected from the second electrode 25 side. The luminous layers 23R, 23G, and 23B are provided in correspondence with the respective sub-pixels 2R, 2G, and 2B as described above.

The electron transfer layer/electron injection layer 24 has the function of increasing efficiency in transporting and injecting electrons from the second electrode 25 into the luminous layer 23. The electron transfer layer/electron injection layer 24 is so formed uniformly on the luminous layer 23 over the entire display region of the TFT substrate 10 as to cover the luminous layer 23.

The second electrode 25 is a layer having the function of injecting electrons into an organic EL layer including the above organic layers. The second electrode 25 is so formed uniformly on the electron transfer layer/electron injection layer 24 over the entire display region of the TFT substrate 10 as to cover the electron transfer layer/electron injection layer 24.

The above stack order of the present embodiment intends to use (i) the first electrode 21 as an anode and (ii) the second electrode 25 as a cathode. The stack order of the organic EL layer is reversed in the case where the first electrode 21 serves as a cathode and the second electrode 25 serves as an anode conversely.

The layers other than the luminous layer 23 are not essential, and may thus be included as appropriate in accordance with a required property of the organic EL element. The organic EL layer may further include a carrier blocking layer according to need. The organic EL layer can, for example, additionally include a hole blocking layer between the luminous layer 23 and the electron transfer layer/electron injection layer to prevent positive holes from transferring from the luminous layer 23 to the electron transfer layer/electron injection layer 24. This can improve luminous efficiency.

The present embodiment forms (i) a single layer to serve as both a hole injection layer and a hole transfer layer and (ii) a single layer to serve as both an electron transfer layer and an electron injection layer. The present embodiment may alternatively form (i) separate layers to serve respectively as a hole injection layer and a hole transfer layer or (ii) separate layers to serve respectively as an electron transfer layer and an electron injection layer.

The description below deals with a method for producing the organic EL display device 1.

FIG. 6 is a flowchart indicating successive steps for producing the organic EL display device 1.

As illustrated in FIG. 6, the method of the present embodiment for producing the organic EL display device 1 includes steps such as a TFT substrate/first electrode preparing step (S1), a partition wall forming step (S2), a hole injection layer/hole transfer layer vapor deposition step (S3), a luminous layer vapor deposition step (S4), an electron transfer layer/electron injection layer vapor deposition step (S5), a second electrode vapor deposition step (S6), and a sealing step (S7).

The following describes, with reference to FIGS. 3 and 5, the above individual steps included in the flowchart illustrated in FIG. 6.

Note, however, that the dimensions, materials, shapes and the like of the respective constituent elements described in the present embodiment are merely of an embodiment, and that the scope of the present invention should not be construed limitedly on the grounds of such aspects of the constituent elements.

The stack order described in the present embodiment, as mentioned above, intends to use (i) the first electrode 21 as an anode and (ii) the second electrode 25 as a cathode. In the converse case where the first electrode 21 serves as a cathode and the second electrode 25 serves as an anode, the stack order of the organic EL layer is reversed, and the respective materials of the first electrode 21 and the second electrode 25 are switched similarly.

First, as illustrated in FIG. 5, the method of the present embodiment (i) applies a photosensitive resin onto an insulating substrate 11 that is made of a material such as glass and that includes, for example, TFTs 12 and wires 14 each formed by a publicly known technique, and (ii) carries out patterning with respect to the photosensitive resin by photolithography. This forms an interlayer film 13 on the insulating substrate 11.

The insulating substrate 11 is, for example, a glass or plastic substrate having (i) a thickness of 0.7 to 1.1 mm, (ii) a length (longitudinal length) of 400 to 500 mm along a y axis direction, and (iii) a length (lateral length) of 300 to 400 mm along an x axis direction. The insulating substrate 11 of the present embodiment was a glass substrate.

The interlayer film 13 can be made of, for example, an acrylic resin or a polyimide resin. The acrylic resin is, for example, a product in the Optomer series available from JSR Corporation. The polyimide resin is, for example, a product in the Photoneece series available from Toray Industries, Inc. Note that since a typical polyimide resin is not transparent but colored, the interlayer film 13 is more suitably made of a transparency resin such as an acrylic resin in the case where an organic EL display device of the bottom emission type is produced as the organic EL display device 1 as illustrated in FIG. 3.

The interlayer film 13 simply needs to have a film thickness that can compensate for the difference in level created by the TFTs 12. The film thickness is thus not particularly limited. The film thickness was approximately 2 µm in the present embodiment as an example.

The method of the present embodiment next forms, in the interlayer film 13, contact holes 13a for electrically connecting the first electrode 21 to the TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist stripping solution, and washes the substrate. This forms, on the interlayer film 13, a first electrode 21 in a matrix.

The conductive film material for the first electrode 21 is, for example, (i) a transparent conductive material such as ITO, IZO (indium zinc oxide), and gallium-added zinc oxide (GZO) or (ii) a metal material such as gold (Au), nickel (Ni), and platinum (Pt).

The above conductive film may also be formed by, instead of the sputtering method, a method such as a vacuum vapor deposition method, a chemical vapor deposition (CVD) method, a plasma CVD method, and a printing method.

The thickness of the first electrode 21 is not particularly limited. The first electrode 21 can have a thickness of, for example, 100 nm as mentioned above.

The method next forms a pattern of an edge cover 15, in a manner similar to the manner of forming the interlayer film 13, to have a film thickness of, for example, approximately 1 µm. The edge cover 15 can be made of an insulating material similar to that of the interlayer film 13.

The step described above prepares the TFT substrate 10 and the first electrode 21 (S1).

The method of the present embodiment next forms, on the edge cover 15 formed in S1, partition walls 26 each having a predetermined height (S2). The partition walls 26 can be made of a photosensitive permanent film resist for a thick film, for example, a product in the SU-8 series available from Nippon Kayaku Co., Ltd. or a product in the KI-1000 series available from Hitachi Chemical Co., Ltd. The method uses a material such as the above, carries out patterning with respect to that material by photolithography, and fires the patterned material to form partition walls 26.

The method of the present embodiment next carries out, with respect to the TFT substrate 10 prepared through the above step, (i) a bake under a reduced pressure for dehydration and (ii) an oxygen plasma treatment for surface washing of the first electrode 21.

The method then carries out vapor deposition of a hole injection layer/hole transfer layer 22 onto the TFT substrate 10 over its entire display region with use of a conventional vapor deposition device (S3).

The vapor deposition method and the vapor deposition device of the present embodiment are each particularly suitably used for a discriminative application formation (pattern formation) of the hole injection layer/hole transfer layer 22.

A description below will deal in detail with a discriminative application formation of the hole injection layer/hole transfer layer 22 which discriminative application formation involves the vapor deposition device and the vapor deposition method of the present embodiment.

The present embodiment causes the hole injection layer/hole transfer layer 22 to be deposited separately on individual sub-pixels adjacent to one another and different from one another in color. This means that no hole injection layer/hole transfer layer 22 is provided on sidewalls of the partition walls 26.

The hole injection layer/hole transfer layer 22 is made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of a heterocyclic conjugated system, such as a thiophene compound and an aniline compound.

The hole injection layer/hole transfer layer 22 of the present embodiment was made of 4,4'-bis [N-(1-naphthyl)-N-phenylamino]biphenyl(α-NPD) and had a film thickness of 30 nm.

The hole injection layer/hole transfer layer 22 may be a single layer as described above or formed as separate layers. Such separate layers each have a film thickness of, for example, 10 to 100 nm.

The method of the present embodiment next carries out a discriminative application formation (pattern formation) of luminous layers 23R, 23G, and 23B onto the hole injection layer/hole transfer layer 22 in correspondence with respective sub-pixels 2R, 2G, and 2B so that the luminous layers 23R, 23G, and 23B cover respective opening regions 15R, 15G, and 15B of the edge cover 15 (S4).

As described above, the luminous layers 23R, 23G, and 23B are each made of a material with high luminous efficiency, such as a low-molecular fluorescent dye or a metal complex.

The luminous layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate) aluminum complex, (iii) a bis (benzohydroxyquinolinate) beryllium complex, (iv) a tri (dibenzoylmethyl) phenanthroline europium complex, (v) and ditoluyl vinyl biphenyl.

The luminous layers 23R, 23G, and 23B each have a film thickness of, for example, 10 to 100 nm.

The vapor deposition method and the vapor deposition device of the present embodiment are each particularly suitably used for a discriminative application formation (pattern formation) of the above luminous layers 23R, 23G, and 23B.

A description below will deal in detail with a discriminative application formation of the luminous layers 23R, 23G, and 23B which discriminative application formation involves the vapor deposition device and the vapor deposition method of the present embodiment.

The method of the present embodiment next carries out vapor deposition of an electron transfer layer/electron injection layer 24 onto the entire display region of the TFT substrate 10 so that the electron transfer layer/electron injection layer 24 covers the hole injection layer/hole transfer layer 22 and the luminous layers 23R, 23G, and 23B (S5).

Specifically, the method (i) carries out an alignment adjustment, relative to the TFT substrate 10, of a shadow mask 81 having an opening corresponding to the entire display region and (ii) places the shadow mask 81 in contact with the TFT substrate 10 at the partition walls formed in S2. The method then, while rotating the TFT substrate 10 and the shadow mask 81 together, carries out, through the opening 82 of the shadow mask 81 and uniformly over the display region, vapor deposition of vapor deposition particles scattered from a vapor deposition source.

The electron transfer layer/electron injection layer 24 is made of a material such as (i) quinoline, perylene, phenanthroline, bistyryl, pyrazine, triazole, oxazole, oxadiazole, fluorenone, or a derivative or metal complex of any of the above, or (ii) LiF.

The electron transfer layer/electron injection layer 24 of the present embodiment was made of Alq(tris (8-hydroxy quinoline) aluminum), and had a film thickness of 30 nm.

As mentioned above, the electron transfer layer and the electron injection layer may be either integrated with each other or formed as separate layers. The electron transfer layer and the electron injection layer each have a film thickness of, for example, 10 to 100 nm. The overall film thickness of the electron transfer layer/electron injection layer is, for example, 20 to 200 nm.

The method of the present embodiment next carries out, in a manner similar to that described for the above electron transfer layer/electron injection layer vapor deposition step (S5), vapor deposition of a second electrode 25 onto the entire display region of the TFT substrate 10 so that the second electrode 25 covers the electron transfer layer/electron injection layer 24 (S6).

The second electrode 25 is suitably made of a material (electrode material) such as a metal with a small work function. Examples of such an electrode material include a magnesium alloy (for example, MgAg), an aluminum alloy (for example, AlLi, AlCa, or AlMg) and calcium metal. The second electrode 25 has a thickness of, for example, 50 to 100 nm.

The second electrode 25 of the present embodiment was made of aluminum and had a film thickness of 50 nm. The operation described above formed, on the TFT substrate 10, an organic EL element 20 including the organic EL layer, the first electrode 21, and the second electrode 25 described above.

The method of the present embodiment then attached (i) the TFT substrate 10, on which the organic EL element 20 was provided, to (ii) a sealing substrate 40 with use of an adhesive layer 30 as illustrated in FIG. 3 so that the organic EL element 20 was contained.

The sealing substrate 40 is, for example, an insulating substrate such as a glass substrate and a plastic substrate, and is 0.4 to 1.1 mm in thickness. The sealing substrate 40 of the present embodiment was a glass substrate.

The longitudinal and lateral lengths of the sealing substrate 40 may each be adjusted as appropriate in accordance with the size of a target organic EL display device 1. The sealing substrate 40 may be an insulating substrate substantially equal in size to the insulating substrate 11 of the TFT substrate 10, in which case a combination of the sealing substrate 40, the TFT substrate 10, and the organic EL element 20 sealed therebetween is divided in accordance with the size of a target organic EL display device 1.

The method for sealing the organic EL element 20 is not limited to the method described above. Examples of other sealing methods include (i) a method in which a centrally depressed glass substrate is used as the sealing substrate 40 and in which the combination of the sealing substrate 40 and the TFT substrate 10 is sealed along the edge in a frame shape with use of, for example, a sealing resin or fritted glass, and (ii) a method in which a space between the TFT substrate 10 and the sealing substrate 40 is filled with a resin. The method for producing the organic EL display device 1 does not depend on the above sealing method, and can employ any of various sealing methods.

The second electrode 25 may be provided thereon with a protective film (not shown) that covers the second electrode 25 and that prevents infiltration of oxygen, moisture and the like present outside into the organic EL element 20.

The protective film is made of an electrically insulating or conductive material such as silicon nitride and silicon oxide. The protective film has a thickness of, for example, 100 to 1000 nm.

Through the above steps, the organic EL display device 1 is finally produced.

The organic EL display device 1 turns on a TFT 12 upon receipt of a signal through a wire 14, and thus allows (i) positive holes to be injected from the first electrode 21 into the organic EL layer and also (ii) electrons to be injected from the second electrode 25 into the organic EL layer. This causes the positive holes and the electrons to recombine with each other inside the luminous layers 23R, 23G, and 23B. The positive holes and the electrons thus recombined are emitted in the form of light when becoming inactive.

In the above organic EL display device 1, controlling respective light emission luminances of the sub-pixels 2R, 2G, and 2B allows a predetermined image to be displayed.

The following describes an arrangement of a vapor deposition device of the present embodiment.

FIG. 1 is a cross-sectional view schematically illustrating an example configuration of the inside of a vacuum chamber of the vapor deposition device of the present embodiment. (a) of FIG. 2 is an enlarged view of the portion E in FIG. 1. FIG. 7 is a bird's eye view of main constituent elements inside the vacuum chamber of the vapor deposition device of the present embodiment. FIG. 8 is a plan view of a film formation substrate and a mask unit both inside the vacuum chamber of the vapor deposition device of the present embodiment, the plan view being taken from a back surface side of the film formation substrate (that is, the side opposite to the vapor deposition surface). For convenience of illustration, FIG. 8 uses a chain double-dashed line to represent the film formation substrate, and omits illustration of the partition walls. FIG. 1 illustrates a cross section of the vapor deposition device, the cross section being taken along line B-B of FIG. 8. FIG. 9 is a block diagram illustrating a part of a configuration of the vapor deposition device of the present embodiment.

The vapor deposition of the present embodiment, as illustrated in FIG. 1, includes: a vacuum chamber 60 (film growing chamber); a substrate moving mechanism 70 (substrate moving means; moving means); a mask unit 80; image sensors 90; and a control circuit 100 (see FIG. 9).

The vapor deposition device 50 of the present embodiment, as illustrated in FIG. 1, includes: a vacuum chamber 60 (film growing chamber); a substrate moving mechanism 70 (substrate moving means; moving means); a mask unit 80; image sensors 90; and a control circuit 100 (see FIG. 9).

As illustrated in FIG. 1, the vacuum chamber 60 contains the substrate moving mechanism 70 and the mask unit 80.

The vacuum chamber 60 is provided with a vacuum pump (not shown) for vacuum-pumping the vacuum chamber 60 via an exhaust port (not shown) of the vacuum chamber 60 to keep a vacuum in the vacuum chamber 60 during vapor deposition.

The substrate moving mechanism 70 includes, for example: a substrate holding member 71 (substrate holding means) for holding a film formation substrate 200 (for example, a TFT substrate 10); and a motor 72 (see FIG. 9).

The substrate moving mechanism 70 causes (i) the substrate holding member 71 to hold the film formation substrate 200 and (ii) a below-described motor drive control section 103 (see FIG. 9) to drive the motor 72 so as to move the film formation substrate 200 in the horizontal direction while hold it. The substrate moving mechanism 70 may be provided to be capable of moving the film formation substrate 200 either (i) in both the x axis direction and the y axis direction or (ii) in one of the x axis direction and the y axis direction.

The substrate holding member 71 is, as illustrated in FIG. 1, an electrostatic chuck (contacting means). In the present embodiment, the electrostatic chuck serving as the substrate holding member 71 causes the shadow mask 81 (vapor deposition mask) to be attracted to the film formation substrate 200 side. Further, the electrostatic chuck serving as the substrate holding member 71 prevents self-weight bending of the film formation substrate 200.

The mask unit 80, as illustrated in FIG. 1, includes: a shadow mask 81; a vapor deposition source 85; a mask holding member 87 (holding means); a mask tension mechanism 88; and a shutter 89 (see FIG. 9).

The shadow mask 81 is, for example, a metal mask.

The shadow mask 81 is so formed as to (i) be smaller in area than a vapor deposition region 210 of the film formation substrate 200 and (ii) have at least one side that is shorter than the width of the vapor deposition region 210 of the film formation substrate 200. The vapor deposition region 210 of the film formation substrate 200 refers to the entire region in which a vapor deposition film 211 having a predetermined pattern is to be formed.

The shadow mask 81 of the present embodiment has a rectangular shape (that is, in the shape of a belt), and is sized as follows: The shadow mask 81 is, as illustrated in FIG. 8, so formed as to have (i) long sides 81a each with a width d1 (that is, the length along the long-side direction [long-axis direction] of the shadow mask 81) that is larger than the width d3 of a side of the vapor deposition region 210 (in the example illustrated in FIG. 8, a long side 210a of the vapor deposition region 210) which side faces the long sides 81a of the shadow mask 81 and (ii) short sides 81b each with a width d2 (that is, the length along the short-side direction [short-axis direction] of the shadow mask 81) that is smaller than the width d4 of a side of the vapor deposition region 210 (in the example illustrated in FIG. 8, a short side 210b of the vapor deposition region 210) which side faces the short sides 81b of the shadow mask 81.

The shadow mask 81, as illustrated in FIGS. 7 and 8, has a plurality of openings 82 (through holes) arranged in a one-dimensional direction and each having the shape of, for example, a belt (that is, in a stripe shape). In the case where, for example, a discriminative application formation of the luminous layers 23R, 23G, and 23B is carried out with respect to the TFT substrate 10 as a pattern formation of vapor deposition films 211 (see FIG. 1) on the film formation substrate 200, the openings 82 are formed in correspondence with the size and pitch of columns for each color of the luminous layers 23R, 23G, and 23B.

The shadow mask 81, as illustrated in FIGS. 1 and 8, includes, for example, alignment marker sections 83 extending along a scanning direction (substrate scanning direction) of the film formation substrate 200. The alignment marker sections 83 include respective alignment markers 84 (see FIG. 1) for use in an alignment between the film formation substrate 200 and the shadow mask 81.

The alignment marker sections 83 of the present embodiment are, as illustrated in FIG. 1, provided along the short sides 81b (short axis) of the shadow mask 81.

The shadow mask 81 has (i) long sides 81a each with a width d1 that is larger than the width d3 of a side of the vapor deposition region 210 which side faces the long sides 81a and (ii) short sides 81b each with a width d2 that is smaller than the width d4 of a side of the vapor deposition region 210 which side faces the short sides 81b. This arrangement allows the alignment marker sections 83 to be formed respectively in opposite end sections arranged along the long-side direction (that is, at the opposite short sides 81b and 81b). The above arrangement thus makes it possible to carry out an alignment easily and more precisely.

The film formation substrate 200, as illustrated in FIG. 8, includes alignment marker sections 220 outside the vapor deposition region 210 and along the scanning direction (substrate scanning direction) of the film formation substrate 200. The alignment marker sections 220 include respective alignment markers 221 (see FIG. 1) for use in an alignment between the film formation substrate 200 and the shadow mask 81.

The alignment marker sections 220 of the present embodiment are, as illustrated in FIG. 8, provided along the respective short sides 210b (short axis) of the vapor deposition region 210 of the film formation substrate 200.

The stripe-shaped openings 82 of the present embodiment are provided to (i) extend along the short side direction of the shadow mask 81, that is, along the substrate scanning direction, and to (ii) be arranged next to one another along the long side direction of the shadow mask 81, that is, along a direction that orthogonally crosses the substrate scanning direction.

Further, as illustrated in FIG. 1, there are provided on the film formation substrate 200 a plurality of partition walls 26 each having a predetermined height, the partition walls 26 being arranged next to one another and each provided between individual film formation regions. This arrangement allows the film formation substrate 200 and the shadow mask 81 to be placed in contact with each other at the partition walls 26 during vapor deposition.

The present embodiment is arranged such that when the film formation substrate 200 is close to the shadow mask 81, the partition walls 26 are each (i) located between openings 82 of the shadow mask 81 and (ii) provided, in a stripe shape that corresponds to the shape of the openings 82 and that extends along the short side direction of the film formation substrate 200 (that is, along the direction in which the film formation substrate 200 is relative moved by the moving means).

The height of the partition walls 26, as illustrated in FIG. 1, corresponds to the gap g1 between the film formation substrate 200 and the shadow mask 81. The partition walls 26 eliminate the risk of direct contact between the film formation substrate 200 and the shadow mask 81.

The gap g1 between the film formation substrate 200 and the shadow mask 81, that is, the height of the partition walls 26, preferably falls within the range of not less than 10 μm and not more than 1 mm, or is more preferably on the order of 50 μm.

If the gap g1 exceeds 1 mm, vapor deposition particles that have passed through the openings 82 of the shadow mask 81 will become spread to be adhered to the partition walls 26 standing on both sides of each vapor deposition region. This will result in waste of vapor deposition particles. On the other hand, if the gap g1 is smaller than 10 μm, the shadow mask 81, the film formation substrate 200 and/or the like will be deformed, which may in turn cause the shadow mask 81 to come into contact with the opening regions 15R, 15G, and 15B and thus damage the first electrode 21, vapor deposition films and the like provided in the opening regions 15R, 15G, and 15B. A larger pixel pitch (that is, a larger distance between partition walls) will cause greater deformation in the shadow mask 81, the film formation substrate 200 and/or the like, and will thus necessitate a larger gap g1.

A gap g1 on the order of 50 µm can sufficiently reduce the pattern width for the vapor deposition films 211, and also prevent the shadow mask 81 from coming into contact with the opening regions 15R, 15G, and 15B.

The vapor deposition source 85 is, for example, a container that contains a vapor deposition material. The vapor deposition source 85 is, as illustrated in FIG. 1, (i) placed to face the shadow mask 81 and (ii) separated from the shadow mask 81 by a fixed gap g2 (void), that is, positioned away from the shadow mask 81 by a fixed distance.

The vapor deposition source 85 may be a container that itself contains a vapor deposition material or a container that includes a load-lock pipe.

The vapor deposition source 85 includes, for example, a mechanism for emitting vapor deposition particles upward.

The vapor deposition source 85 has, on a surface facing the shadow mask 81, a plurality of emission holes 86 for emitting (scattering) the vapor deposition material in the form of vapor deposition particles.

The present embodiment is arranged, as described above, such that (i) the vapor deposition source 85 is provided below the film formation substrate 200 and that (ii) the film formation substrate 200 is held by the substrate holding member 71 in such a state that the vapor deposition region 210 faces downward. Thus, in the present embodiment, the vapor deposition source 85 carries out vapor deposition of vapor deposition particles through the openings 82 of the shadow mask 81 onto the film formation substrate 200 upward from below (that is, up deposition; hereinafter referred to as "depo-up").

The emission holes 86 are, as illustrated in FIGS. 1 and 7, provided to face the respective openings 82 of the shadow mask 81 so as to be open in respective opening regions of the shadow mask 81. The emission holes 86 of the present embodiment are arranged one-dimensionally (i) along the direction in which the openings 82 of the shadow mask 81 are arranged next to one another and (ii) so as to face the respective openings 82 of the shadow mask 81.

Thus, as illustrated in FIGS. 7 and 8, the vapor deposition source 85 is formed to have a surface that faces the shadow mask 81, the surface (that is, the surface in which the emission holes 86 are provided) having, for example, a rectangular shape (belt shape) as viewed from the back surface side of the film formation substrate 200 (that is, in a plan view) so as to match the rectangular shape (belt shape) of the shadow mask 81.

In the mask unit 80, the shadow mask 81 and the vapor deposition source 85 are fixed in position relative to each other. Specifically, there is constantly a fixed gap g2 between (i) the shadow mask 81 and (ii) the surface of the vapor deposition source 85 in which surface the emission holes 86 are provided, and there is constantly a fixed positional relationship between (i) the openings 82 of the shadow mask 81 and (ii) the emission holes 86 of the vapor deposition source 85. The positional relationship between the shadow mask 81 and the vapor deposition source 85 is, however, not an essential condition for the present invention, and may thus be changed.

The emission holes 86 of the vapor deposition source 85 are each so placed as to coincide with the center of a corresponding opening 82 of the shadow mask 81 when the mask unit 80 is viewed from the back surface side of the film formation substrate 200 (that is, in a plan view).

The shadow mask 81 and the vapor deposition source 85 are, for example, attached to the mask holding member 87 (for example, an identical holder) for holding and fixing (i) the shadow mask 81 via the mask tension mechanism 88 and (ii) the vapor deposition source 85 (see FIG. 1). The shadow mask 81 and the vapor deposition source 85 are thus so integrated with each other as to be held and fixed in the respective positions relative to each other.

The shadow mask 81 is under tension caused by the mask tension mechanism 88. The shadow mask 81 is thus adjusted as appropriate so that no bend or elongation due to its own weight is caused.

The shutter 89 is used according to need in order to control reaching of vapor deposition particles to the shadow mask 81. The shutter 89 is either closed or opened by a shutter drive control section 105 (see FIG. 9) in accordance with a vapor deposition OFF signal or vapor deposition ON signal from a vapor deposition ON/OFF control section 104 (see FIG. 9) described below.

The shutter 89 (see FIG. 9) is, for example, provided to be capable of moving in a space between the shadow mask 81 and the vapor deposition source 85 (that is, capable of being inserted between them). The shutter 89 is inserted between the shadow mask 81 and the vapor deposition source 85 to close the openings 82 of the shadow mask 81. Appropriately inserting the shutter 89 between the shadow mask 81 and the vapor deposition source 85 can prevent vapor deposition on a portion for which vapor deposition is unnecessary (that is, a non vapor deposition region).

The vapor deposition device 50 is so adjusted that vapor deposition particles from the vapor deposition source 85 are scattered below the shadow mask 81. The vapor deposition device 50 may be arranged such that vapor deposition particles scattered beyond the shadow mask 81 are blocked as appropriate by, for example, a deposition preventing plate (shielding plate).

The vacuum chamber 60 is provided with, for example, image sensors 90 (see FIG. 9) each (i) attached to an outer surface of the vacuum chamber 60, (ii) including a CCD, and (iii) serving as image sensing means (image reading means). The vacuum chamber 60 is further provided with a control circuit 100 (i) attached to the outer surface of the vacuum chamber 60, (ii) connected to the image sensors 90, and (iii) serving as control means.

The image sensors 90 each function as position detecting means for use in an alignment of the film formation substrate 200 and the shadow mask 81.

The control circuit 100 includes: an image detecting section 101; a computing section 102; a motor drive control section 103; a vapor deposition ON/OFF control section 104; and a shutter drive control section 105.

As described above, the film formation substrate 200 includes, as illustrated in FIG. 8, alignment marker sections 220 provided (i) outside the vapor deposition region 210 and (ii) along, for example, the substrate scanning direction. The alignment marker sections 220 each include an alignment marker 221.

The image detecting section 101 detects, on the basis of an image captured by the image sensors 90, respective images of (i) the alignment markers 221 included in the film formation substrate 200 and (ii) the alignment markers 84 of the shadow mask 81. The image detecting section 101 further detects the start end and rear end of the vapor deposition region 210 of the film formation substrate 200 on the basis of, among the alignment markers 221 included in the film formation substrate 200, (i) a start-end marker indicative of the start end of the vapor deposition region 210 and (ii) a rear-end marker indicative of the rear end of the vapor deposition region 210.

The start-end marker and the rear-end marker mentioned above may be identical to each other. In this case, the image detecting section 101 detects, with respect to the substrate scanning direction, whether a particular end of the vapor deposition region 210 is its start end or rear end.

The computing section 102 determines, from the image detected by the image detecting section 101, the amount of movement of the film formation substrate 200 and the shadow mask 81 relative to each other (for example, the amount of movement of the film formation substrate 200 relative to the shadow mask 81). The computing section 102, for example, measures the amount of positional difference (that is, a shift component along the x axis direction and the y axis direction, and a rotation component on the x-y plane) between the alignment markers 221 and the alignment markers 84 to determine a correction value for a substrate position of the film formation substrate 200 by computation. In other words, the computing section 102 determines the correction value by computation with respect to (i) the direction perpendicular to the substrate scanning direction and (ii) a rotation direction of the film formation substrate 200.

The rotation direction of the film formation substrate refers to a direction of rotation on the x-y plane about a z axis, serving as a rotation axis, at the center of a film formation surface of the film formation substrate 200.

The correction value is outputted in the form of a correction signal to the motor drive control section 103. The motor drive control section 103, on the basis of the correction signal from the computing section 102, drives the motor 72 connected to the substrate holding member 71, and thus corrects the substrate position of the film formation substrate 200.

How the substrate position is corrected with use of the alignment markers 84 and 221 will be described below together with example shapes of the alignment markers 84 and 221.

The motor drive control section 103 drives the motor 72 to move the film formation substrate 200 in the horizontal direction as mentioned above.

The vapor deposition ON/OFF control section 104 generates (i) a vapor deposition OFF signal when the image detecting section 101 has detected the rear end of the vapor deposition region 210 and (ii) a vapor deposition ON signal when the image detecting section 101 has detected the start end of the vapor deposition region 210.

The shutter drive control section 105 (i) closes the shutter 89 upon receipt of a vapor deposition OFF signal from the vapor deposition ON/OFF control section 104 and (ii) opens the shutter 89 upon receipt of a vapor deposition ON signal from the vapor deposition ON/OFF control section 104.

The following describes (i) how the substrate position is corrected with use of the alignment markers 84 and 221 and (ii) example shapes of the alignment markers 84 and 221.

(a) through (c) of FIG. 10 illustrate example shapes of the alignment markers 84 and 221. (b) and (c) of FIG. 10 each illustrate only two of the juxtaposed alignment markers 84 and of the juxtaposed alignment markers 221 for convenience of illustration.

The computing section 102, on the basis of an image of the alignment markers 84 and 221, the image having been detected by the image detecting section 101, measures (determines) (i) a distance r between respective ends (outer edges) of each alignment marker 84 and its corresponding alignment marker 221 along the x axis direction and (ii) a distance q between respective ends (outer edges) of each alignment marker 84 and its corresponding alignment marker 221 along the y axis direction. The computing section 102 thus determines the amount of positional difference in alignment to compute a correction value for a substrate position.

In the case where, for example, the substrate scanning direction is the x axis direction, the sign "r" in (a) through (c) of FIG. 10 indicates a distance between the respective ends along the substrate scanning direction, whereas the sign "q" in (a) through (c) of FIG. 10 indicates a distance between the respective ends along the direction perpendicular to the substrate scanning direction. The computing section 102 measures (determines) the distances r and q at, for example, opposite ends of the vapor deposition region 210 of the film formation substrate 200 to determine the amount of shift caused in alignment during a substrate scan.

The present embodiment describes an example case that involves simultaneously scanning the film formation substrate 200 and carrying out an alignment between the shadow mask 81 and the film formation substrate 200 as described below. The present embodiment is, however, not limited to such an arrangement. The present embodiment can alternatively be arranged such that a sufficient alignment is carried out before a substrate scan and that no alignment is carried out during a substrate scan.

The present embodiment can be arranged as in an embodiment described below such that, for example, the film formation substrate 200 is moved along a first side of the vapor deposition region 210 of the film formation substrate 200 (for example, along the y axis direction in (a) through (c) of FIG. 10), and is then moved along a second side (for example, the x axis direction in (a) through (c) of FIG. 10) orthogonal to the first side. In this case, the sign "r" in (a) through (c) of FIG. 10 indicates a distance between the respective ends along the direction perpendicular to the substrate scanning direction, whereas the sign "q" in (a) through (c) of FIG. 10 indicates a distance between the respective ends along the direction (shift direction) in which the film formation substrate 200 is moved.

In this case, the computing section 102 measures distances r and q for alignment markers located at the four corners, and thus determines (i) the amount of positional difference present in alignment at the start of a substrate scan and (ii) the amount of positional difference present in alignment after the film formation substrate 200 has been moved (shifted).

The alignment markers 84 and 221 may each be, as illustrated in (a) through (c) of FIG. 10, in the shape of, for example, (i) a belt, (ii) a quadrangle such as a square, (iii) a frame, or (iv) a cross. The alignment markers 84 and 221 are thus not particularly limited in terms of shape.

The following describes in detail an example method for forming a pattern of an organic EL layer by using, as a device for producing the organic EL display device 1, the above vapor deposition device 50 of the present embodiment.

The present embodiment assumed (i) 100 mm for the gap g2 between the vapor deposition source 85 and the shadow mask 81 (that is, the distance between a surface of the vapor deposition source 85 in which surface the emission holes 86 were provided and the shadow mask 81) and (ii) 40 μm for the gap g1 (that is, the height of the partition walls 26) between the TFT substrate 10 serving as the film formation substrate 200 and the shadow mask 81.

The present embodiment further assumed (i) for a substrate size of the TFT substrate 10, 320 mm along the scanning direction and 400 mm along the direction perpendicular to the scanning direction and (ii) for widths of the vapor deposition region 210 (display region), 260 mm for the width along the scanning direction (that is, the width d4) and 310 mm for the width (that is, the width d3) along the direction perpendicular to the scanning direction.

The present embodiment assumed 360 μm (along the scanning direction)×90 μm (along the direction perpendicular to the scanning direction) for widths of the opening regions 15R, 15G, and 15B for the respective sub-pixels 2R, 2G, and 2B of the TFT substrate 10. The present embodiment further assumed 480 μm (along the scanning direction)×160 μm (along the direction perpendicular to the scanning direction) for a pitch between the opening regions 15R, 15G, and 15B. The pitch between the opening regions 15R, 15G, and 15B (that is, a pitch between pixel openings) refers to a pitch between respective opening regions 15R, 15G, and 15B for the sub-pixels 2R, 2G, and 2B adjacent to one another, but not to a pitch between sub-pixels of an identical color.

The present embodiment used, as the shadow mask 81, a shadow mask having (i) a length of 600 mm along the width d1 (that is, the width along the direction perpendicular to the scanning direction) along each long side 81*a* (corresponding to the long-axis direction) and (ii) a length of 200 mm along the width d2 (that is, the width along the scanning direction) along each short side 81*b* (corresponding to the short-axis direction). The shadow mask 81 had openings 82 (i) each having opening widths of 150 mm (along the width d5 in the long-axis direction; see FIG. 8)×110 μm (along the width d6 in the short-axis direction; see FIG. 8), (ii) having, along an interval d8 (see FIG. 8) between adjacent openings 82 and 82, a length of 50 μm with respect to the hole injection layer/hole transfer layer and a length of 370 μm with respect to the luminous layer, and (iii) having, along a pitch p (see FIG. 8) between respective centers of adjacent openings 82 and 82, a length of 160 μm with respect to the hole injection layer/hole transfer layer and a length of 480 μm with respect to luminous layer.

In the present embodiment, the shadow mask 81 preferably has a length of not less than 200 mm for the width d2 (that is, a short side length) along each short side 81*b*. This is due to the reason below.

The vapor deposition rate is preferably not higher than 10 nm/s. If the vapor deposition rate exceeds 10 nm/s, a deposited film (that is, a vapor deposition film 211) will have a decreased uniformity, thus resulting in a decreased organic EL property.

A vapor deposition film 211 typically has a film thickness of not larger than 100 nm. A film thickness of larger than 100 nm will require application of a high voltage, and consequently increase power consumption of a produced organic EL display device. The above vapor deposition rate and the film thickness of a vapor deposition film 211 allow estimation of a necessary vapor deposition period of 10 seconds or longer.

Due to a limit in processing capability (tact time), a scan rate of 13.3 mm/s or higher is at least necessary in order to, for example, complete vapor deposition with respect to a 2 m-wide glass substrate in 150 seconds. The processing time of 150 seconds is a tact time that allows processing of about 570 glass substrates per day.

Securing the above vapor deposition period of 10 seconds or longer at the above scan rate requires the shadow mask 81 to have openings 82 each having a width of at least 133 mm along the scanning direction.

Assuming that approximately 30 mm is appropriate for the distance (margin width d7; see FIG. 8) from each end of an opening 82 to a corresponding end of the shadow mask 81, the shadow mask 81 requires a length of 133+30+30≈200 mm for the width along the scanning direction.

The shadow mask 81 thus preferably has a short side length (that is, the width d2) of not less than 200 mm. The short side length is, however, not limited to not less than 200 mm if there is a change in the vapor deposition rate, the film thickness of a vapor deposition film 211, and/or the allowable amount of the tact time.

The present embodiment assumed 30 mm/s for the rate of scanning the TFT substrate 10.

The description below deals with an example case that, as described above, involves (i) using, as the film formation substrate 200, a TFT substrate 10 obtained after the partition wall forming step (S2) is finished and (ii) carrying out, as a pattern formation of an organic EL layer, vapor deposition of a hole injection layer/hole transfer layer 22 during the hole injection layer/hole transfer layer vapor deposition step (S3).

The method first, as illustrated in FIG. 1, places the shadow mask 81 above the vapor deposition source 85 in the vacuum chamber 60, and horizontally holds the shadow mask 81 under tension by the mask tension mechanism 88. The method then carries out an adjustment with use of the alignment markers 84 of the shadow mask 81 in such a manner that the substrate scanning direction is identical to the long-axis direction of the stripe-shaped openings 82 provided in the shadow mask 81.

The method next inserted the TFT substrate 10 in the vacuum chamber 60 and carried out an adjustment with use of the alignment markers 221 of the TFT substrate 10 so that each pixel column of an identical color of the TFT substrate 10 had a direction that was identical to the substrate scanning direction (S11 in FIG. 12). The method then placed the shadow mask 81 and the TFT substrate 10 on top of each other at a substrate end to carry out a rough alignment between the shadow mask 81 and the TFT substrate 10 (S12 in FIG. 12), and at that portion, placed the shadow mask 81 and the TFT substrate 10 in contact with each other at the partition walls 26 (contacting step; S13 in FIG. 12).

The method next scanned the TFT substrate 10, and while keeping the TFT substrate 10 and the shadow mask 81 in contact with each other at partition walls 26, carried out a substrate scan in such a manner that the TFT substrate 10 passed through a position directly above the shadow mask 81. The above step simultaneously carried out, as illustrated in (a) of FIG. 11, the scan and a precise alignment with use of the respective alignment markers 221 and 84 so that each pixel column (sub-pixel columns 2R, 2G, and 2B) of the TFT substrate 10 coincided with a corresponding opening 82 of the shadow mask 81 (S14 in FIG. 12).

FIG. 13 is a flowchart illustrating the alignment adjustment method. The alignment is adjusted as illustrated in the flow of FIG. 13.

The method first captures, with use of the image sensors 90, a substrate position of the TFT substrate 10 serving as the film formation substrate 200 (S21 in FIG. 13).

Next, the image detecting section 101, on the basis of the image captured by the image sensors 90, detects respective images of (i) the alignment markers 221 of the TFT substrate 10 and of (ii) the alignment markers 221 of the shadow mask 81 (S22 in FIG. 13).

Then, the computing section 102 calculates, from the respective images of the alignment markers 221 and 84, the images having been detected by the image detecting section 101, the amount of positional difference between the alignment markers 221 and the alignment markers 84 to determine a correction value for a substrate position by computation (S23 in FIG. 13).

Next, the motor drive control section 103 drives the motor 72 on the basis of the correction value to correct the substrate position (S24 in FIG. 13).

Then, the image sensors 90 detect the substrate position as corrected, after which the steps S21 through S25 are repeated.

As described above, the present embodiment causes the image sensors 90 to repeatedly detect a substrate position to correct it. This makes it possible to simultaneously carry out a substrate scan and correct a substrate position, and consequently to form a film while carrying out a precise alignment between the TFT substrate 10 and the shadow mask 81.

The present embodiment then reversed the scanning direction of the TFT substrate 10, and deposited the material of the hole injection layer/hole transfer layer at an identical position by a method similar to above method. This formed, in each of the opening regions 15R, 15G, and 15B of the respective sub-pixels, a hole injection layer/hole transfer layer 22 having a film thickness of 30 nm (S16 in FIG. 12).

While in S14 through S16, the non vapor deposition region of the TFT substrate 10 was positioned directly above the openings 82 of the shadow mask 81 (for example, during the period after the step in S14 ended and before the scanning direction was reversed in S16), the shutter 89 was inserted between the vapor deposition source 85 and the shadow mask 81 to prevent vapor deposition particles from adhering to the non vapor deposition region (S15 in FIG. 12).

The following describes, with reference to FIGS. 14 and 15, a vapor deposition control in S15 which vapor deposition control involves the shutter 89.

FIG. 14 is a flowchart illustrating a flow of a vapor deposition control carried out when vapor deposition is turned OFF. FIG. 15 is a flowchart illustrating a flow of a vapor deposition control carried out when vapor deposition is turned ON.

The description below first deals with the flow carried out when vapor deposition is turned OFF.

As indicated in FIG. 14, the substrate position of the TFT substrate 10 serving as the film formation substrate 200 is constantly captured by the image sensors 90 during a vapor deposition process as described above with reference to FIG. 13 (S31 in FIG. 14).

As indicated in FIG. 13, the image detecting section 101, on the basis of an image captured by the image sensors 90, detects respective images of (i) the alignment markers 221 of the TFT substrate 10 and of (ii) the alignment markers 221 of the shadow mask 81. The image detecting section 101 detects, as an alignment marker 221 of the TFT substrate 10, a rear-end marker indicative of the rear end of the vapor deposition region to detect the rear end of the vapor deposition region 210 as indicated in FIG. 14 (S32 in FIG. 14).

When the image detecting section 101 has detected the rear end of the vapor deposition region 210 as described above, the vapor deposition ON/OFF control section 104 generates a vapor deposition OFF signal (S33 in FIG. 14).

The shutter drive control section 105, upon receipt of the vapor deposition OFF signal from the vapor deposition ON/OFF control section 104, closes the shutter 89 (S34 in FIG. 14). The shutter 89 thus closed prevents vapor deposition particles from reaching the mask, which achieves the state of vapor deposition OFF (S35 in FIG. 14).

The description below now deals with the flow carried out when vapor deposition is turned ON.

As indicated in FIG. 15, the substrate position of the TFT substrate 10 serving as the film formation substrate 200 is, as described above, constantly captured by the image sensors 90 during a vapor deposition process (S41 in FIG. 15).

The image detecting section 101 detects, as an alignment marker 221 of the TFT substrate 10, a start-end marker indicative of the start end of the vapor deposition region to detect the start end of the vapor deposition region 210 (S42 in FIG. 15).

When the image detecting section 101 has detected the rear end of the vapor deposition region 210, the vapor deposition ON/OFF control section 104 generates a vapor deposition ON signal (S43 in FIG. 15).

The shutter drive control section 105, upon receipt of the vapor deposition ON signal from the vapor deposition ON/OFF control section 104, opens the shutter 89 (S44 in FIG. 15). The shutter 89 thus opened allows vapor deposition particles to reach the mask, which achieves the state of vapor deposition ON (S45 in FIG. 15).

The reciprocating scan in S16 above is carried out as follows: First, through the steps S21 to S24, the substrate is scanned while a precise alignment is carried out. When the image detecting section 101 has detected the rear end of the vapor deposition region 210, the motor drive control section 103 drives the motor 72 to reverse the direction of scanning the TFT substrate 10. During this operation, (i) vapor deposition is turned OFF through the steps S31 to S35, (ii) the position of the TFT substrate 10 is corrected through the steps S21 to S24, and (iii) vapor deposition is turned ON at the start end of the vapor deposition region 210 through the steps S41 to S45. Then, the substrate is scanned again while a precise alignment is carried out through the steps S21 to S24.

The above operation forms a luminous layer 23R having a desired film thickness as indicated in S16.

The present embodiment, after the step S16, retrieved from the vacuum chamber 60 the TFT substrate 10 on which the hole injection layer/hole transfer layer 22 was formed (S17).

The description below deals with another example case that involves (i) using a TFT substrate 10 obtained after the hole injection layer/hole transfer layer vapor deposition step (S3) is finished and (ii) carrying out, as a pattern formation of an organic EL layer, a discriminative application formation of a luminous layer 23R (see (b) of FIG. 11) on the TFT substrate 10 during the luminous layer vapor deposition step (S4).

This example case was similar to the case of carrying out vapor deposition of the material of the hole injection layer/hole transfer layer. Specifically, the method of this example case inserted the TFT substrate 10 (S11 in FIG. 12), carried out a rough alignment (S12 in FIG. 12), and placed the TFT substrate 10 and the shadow mask 81 in contact with each other at the partition walls 26 (S13 in FIG. 12). The method then simultaneously carried out, as illustrated in (b) of FIG. 11, a scan and a precise alignment with use of the alignment markers 221 and 84 so that the red pixel column (sub-pixel column 2R) of the TFT substrate 10 coincided with a corresponding opening 82 of the shadow mask 81. The method also carried out vapor deposition of a luminous layer 23R through a substrate scan similar to that for the hole injection layer/hole transfer layer 22. This caused vapor deposition particles scattered from the vapor deposition source 85 to be adhered to a desired position on the TFT substrate 10 (S14 in FIG. 12). A reciprocating scan of the substrate produced a luminous layer having a predetermined film thickness (S16 in FIG. 12).

In patterning the luminous layers 23, similarly to the formation of the hole injection layer/hole transfer layer 22, while in S14 through S16, the non vapor deposition region of the TFT substrate 10 was positioned directly above the openings 82 of the shadow mask 81 (for example, during the period after the step in S14 ends and before the scanning direction is reversed in S16), the shutter 89 was inserted between the vapor deposition source 85 and the shadow mask 81 to prevent vapor deposition particles from adhering to the non vapor deposition region (S15 in FIG. 12).

The method, after the step S16, retrieved from the vacuum chamber 60 the TFT substrate 10 on which the luminous layer 23R was formed (S17 in FIG. 12).

The luminous layer 23R was made of red organic materials of (i) 3-phenyl-4(1'-naphthyl)-5-phenyl-1,2,4-triazole (TAZ) (host material) and (ii) bis(2-(2'-benzo[4,5-α]thienyl) pyridinato-N,C3')iridium (acetylacetonate) (btp2Ir(acac)) (red-light emitting dopant). These materials were codeposited at respective vapor deposition rates of 5.0 nm/s and 0.53 nm/s to form the luminous layer 23R. The vapor deposition thus performed involved reversal of the substrate scanning direction as in the case for the hole injection layer/hole transfer layer 22. This produced a red luminous layer 23R having a film thickness of 50 nm.

The method then formed a green luminous layer 23G, with use of (i) a mask unit 80 for forming the green luminous layer 23G and (ii) a vacuum chamber 60, in a manner similar to the above process of forming the luminous layer 23R.

The method, after thus forming the luminous layer 23G, formed a blue luminous layer 23B, with use of (i) a mask unit 80 for forming the blue luminous layer 23B and (ii) a vacuum chamber 60, in a manner similar to the respective processes of forming the luminous layers 23R and 23G.

As described above, blue luminous layer materials for the luminous layer 240B were (i) TAZ (host material) and (ii) 2-(4'-t-butyl phenyl)-5-(4"-biphenylyl)-1,3,4-oxadiazole (t-Bu PBD) (blue-light emitting dopant). These materials were codeposited at respective vapor deposition rates of 5.0 nm/s and 0.67 nm/s to form a luminous layer 23B having a film thickness of 50 nm.

Further, green luminous layer materials for the luminous layer 23G were (i) TAZ (host material) and (ii) Ir(ppy) 3 (green-light emitting dopant). These materials were codeposited at respective vapor deposition rates of 5.0 nm/s and 0.67 nm/s to form a luminous layer 23G having a film thickness of 50 nm.

The above steps prepared a TFT substrate 10 on which were formed respective patterns of the luminous layers 23 having respective colors of red (R), green (G), and blue (B). According to the present embodiment, it is possible to produce an organic EL display device 1 larger in size than conventional organic EL display devices through production involving the use of (i) the above vapor deposition device 50 as a device for producing the organic EL display device 1 and (ii) the above vapor deposition method.

Conventional mask vapor deposition methods each carry out vapor deposition in a state in which a shadow mask and a film formation substrate are integrated with each other by, for example, (i) aligning the shadow mask and the film formation substrate with each other and attaching them to each other or (ii) placing the shadow mask and the film formation substrate in contact with each other by magnetic force. Further, conventional mask vapor deposition methods each use a shadow mask substantially equal in size to the film formation substrate.

In consequence, conventional mask vapor deposition methods each problematically cause a gap between the film formation substrate and the shadow mask due to self-weight bending and/or elongation of the shadow mask, and thus cause vapor deposition mispositioning and/or color mixture, with the result of difficulty in achieving high resolution.

In addition, conventional mask vapor deposition methods each use a vapor deposition source fixed to a vacuum chamber. Thus, in the case where (i) a small-sized shadow mask is used and (ii) vapor deposition is sequentially carried out with respect to partial regions of the film formation substrate while the shadow mask is moved, it is necessary to (i) use an adhesion prevention shielding plate so that no vapor deposition particles are adhered to a region of the film formation substrate which region is not covered by the shadow mask and (ii) sequentially move the shielding plate in synchronization with the shadow mask. Such a necessity requires a complex structure.

Further, in the case where no movable shielding plate is used, and in accordance with movement of the shadow mask, (i) each vapor deposition source is turned ON which corresponds to a region for which the moved shadow mask has an opening and (ii) the other vapor deposition sources are turned OFF, it is necessary to use a highly controlled planar vapor deposition source having a substrate size and a uniform evaporation distribution. In addition, such a vapor deposition device will have a low processing efficiency because a vapor deposition source in the OFF state is not in operation.

In contrast, the present embodiment, as described above, differs from conventional techniques in that it (i) integrates the shadow mask 81 with the vapor deposition source 85 (that is, fixes the respective positions relative to each other) to secure partition walls 26 between the TFT substrate 10 serving as the film formation substrate 200 and the shadow mask 81, and (ii) passes the TFT substrate 10 through a position directly above the shadow mask 81, while keeping the TFT substrate 10 in contact with the shadow mask 81 at the partition walls 26, to scan the TFT substrate 10 so that vapor deposition particles having passed through the openings 82 of the shadow mask 81 are deposited onto the TFT substrate 10.

More specifically, the present embodiment (i) uses the mask unit 80 and (ii) for example, moves the TFT substrate 10 relative to the mask unit 80 in a state in which there are provided partition walls 26 having a fixed height (for example, g1) between the TFT substrate 10 and the mask unit 80. Further, the openings 82 of the shadow mask 81 being each located between partition walls 26 cause vapor deposition particles emitted from the emission holes 86 of the vapor deposition source 85 to be sequentially deposited onto the vapor deposition region 210 at the vapor deposition surface of the TFT substrate 10 through the openings 82 of the shadow mask 81. The above arrangement thus makes it possible to form a predetermined pattern on the vapor deposition region 210 of the TFT substrate 10.

The present embodiment includes partition walls 26 each separating adjacent pixels from each other, and can thus prevent vapor deposition particles from entering an adjacent pixel. This prevents display quality from being impaired due to color mixture. Further, the present embodiment causes the shadow mask 81 to be in contact with only the partition walls 26, and can thus prevent the shadow mask 81 from coming into contact with a light-emitting region to damage an organic EL element on the TFT substrate 10. In addition, sufficiently securing the height of the partition walls 26 can prevent the shadow mask 81 from coming into contact with a light-emitting region even if the shadow mask 81 vibrates during a substrate scan. The partition walls 26 each preferably have a height that is equal to or larger than one-tenth of the width between the partition walls. Since the width between the partition walls 26 of the present embodiment is 130 µm, the height simply needs to be equal to or larger than 13 µm.

The present embodiment differs from conventional techniques in that it uses a shadow mask 81 (vapor deposition mask) smaller in area than a TFT substrate 10 (film formation substrate) and has no need to use a mask equivalent in size to the TFT substrate 10. The present embodiment thus prevents such problems with a vapor deposition method involving the use of a conventional mask as a larger mask causing self-weight bending and/or elongation thereof and requiring an extremely heavy mask frame. The present embodiment thus allows formation of a pattern of an organic EL layer even on a large-sized TFT substrate 10.

If, for instance, there has been caused in a conventional mask vapor deposition method a void between a shadow mask and a film formation substrate due to, for example, self-weight bending of the shadow mask which self-weight bending has been caused by a larger size of the shadow mask, vapor deposition particles that have entered an opening of the shadow mask in an oblique direction will pass through the void in such an oblique direction to be adhered to the film formation substrate (see (a) of FIG. 16). The above void will thus cause some vapor deposition particles to be undesirably scattered in correspondence with the entry angle and the width of the void. The tangent of the entry angle and the void are each directly proportional to the undesirable scattering of vapor deposition particles.

The present embodiment, in contrast, includes partition walls 26 on respective opposite sides of a position on the film formation substrate 200 which position coincides with an opening 82 of the shadow mask 81 (see FIG. 2). With this arrangement, vapor deposition particles that have fallen through the shadow mask 81 in an oblique direction as illustrated in (b) of FIG. 16 are blocked by the partition walls 26. Such vapor deposition particles, which would otherwise be undesirably scattered, are inevitably contained within a target pixel. The amount of such undesirable scattering thus does not depend on the angle of entry of vapor deposition particles or the height of the partition walls 26. Further, the present embodiment can reliably prevent color mixture and property impairment from occurring due to undesirable scattering of vapor deposition particles into adjacent pixels.

Further, an opening 82 of the shadow mask 81 being located between partition walls 26 prevents the material of the hole injection layer/hole transfer layer 22 or the luminous layer 23 from adhering to upper surfaces of partition walls 26. Thus, even when the shadow mask 81 is slid during a substrate scan while being in contact with the upper surfaces of the partition walls 26, there is no risk of (i) an already deposited film being peeled off or (ii) a property of the organic EL element being damaged due to the peeling.

In the present embodiment, vapor deposition particles scattered (flying) substantially vertically from the vapor deposition source 85 toward the shadow mask 81 pass through the openings 82 of the shadow mask 81, and fly substantially vertically to be adhered to the TFT substrate 10 to form a vapor deposition film 211. The present invention includes partition walls 26 each having a fixed height between the TFT substrate 10 and the shadow mask 81, which maintains the gap between the TFT substrate 10 and the shadow mask 81 even while the TFT substrate 10 is scanned. This makes it possible to form a vapor deposition film 211 having a uniform width and a uniform film thickness.

The present embodiment thus makes it possible to form a pattern of an organic layer that is uniform over a surface of the substrate, and consequently to produce an organic EL display device 1 having high display quality.

In addition, carrying out vapor deposition while scanning the TFT substrate 10 as described above makes it possible to form a highly uniform vapor deposition film 211 on the TFT substrate 10 while maintaining high material use efficiency.

The present embodiment, which uses a shadow mask 81 smaller in area than the TFT substrate 10 as described above, prevents such problems as follows: A larger sized shadow mask requires a frame for holding the shadow mask to be extremely large and extremely heavy, which in turn requires a device handling such a frame to be also extremely large and complex and which consequently poses a hazard in handling such a device during a production process. The above arrangement, which prevents such problems, facilitates device design (smaller sized device) and improves safety in, for example, mask replacement.

The present embodiment is configured as illustrated in (a) of FIG. 17 to include partition walls 26 that each have no discontinuous portion and that are so provided as to sandwich sub-pixel columns. The present invention is, however, not limited to such a configuration. The partition walls 26 may alternatively be, for example, formed intermittently as illustrated in (b), (c), and (d) of FIG. 17.

In the case where the partition walls 26 have been formed intermittently as above, even if the second electrode 25 has lost electrical connection at a wall surface of the partition walls 26 each having a large taper angle, such electrical connection of the second electrode 25 can be secured through a discontinuous portion (that is, a portion at which a partition wall is discontinuous).

In the case where, for instance, the wall surfaces of the partition walls 26 are in a reverse tapered shape (the taper angle exceeds 90°), no material of the second electrode 25 is adhered to the wall surfaces of the partition walls during vapor deposition. This causes the second electrode 25 to be in the shape of separate stripes extending along the pixel column direction. With such a shape, a current flows only through a path along the direction in which the stripes extend, which in turn increases the resistance of the second electrode 25. Such a second electrode 25 causes a voltage drop, and thus causes non-uniformity in voltage applied to individual pixels within a display region. The partition walls 26 each having a discontinuous portion cause a current to flow through a mesh-shaped path, which can in turn prevent an increase in the resistance of the second electrode 25.

In the case where the present embodiment forms a pattern of a vapor deposition film while scanning the TFT substrate 10, vapor deposition particles may enter an adjacent pixel through a discontinuous portion to cause color mixture as illustrated in (a) of FIG. 18, for example. To prevent such a problem, the present embodiment simply needs to be arranged such that any straight line along which vapor deposition particles for a pixel can pass through a discontinuous portion does not pass through a light-emitting region of another pixel in a plan view of pixels as illustrated in (b) of FIG. 18. With such an arrangement, even if some vapor deposition particles have passed through a discontinuous portion and entered an adjacent pixel, such vapor deposition particles will not adhere to a light-emitting region of another pixel. The above arrangement thus prevents color mixture.

The present embodiment, which fixes the respective positions of the shadow mask 81 and the vapor deposition source 85 relative to each other as described above, simply needs to, for example, move the TFT substrate 10 for a substrate scan. The present embodiment thus eliminates the need to, as conventional, (i) move the shadow mask in a state in which the shadow mask is in contact with the film formation substrate or (ii) move a vapor deposition source relative to the film formation substrate with which the shadow mask is in contact as above.

The above arrangement thus eliminates the unnecessity to include a complicated mechanism for (i) firmly fixing the shadow mask and the film formation substrate to each other to prevent mispositioning thereof and (ii) moving both the shadow mask and the film formation substrate. The above arrangement further eliminates the unnecessity to carry out precise vapor deposition amount control and movement control for a vapor deposition source for the purpose of achieving a uniform film thickness.

The present embodiment, which fixes the respective positions of the shadow mask 81 and the vapor deposition source 85 relative to each other as described above, eliminates the need to include a shielding plate for preventing vapor deposition particles from adhering to an unnecessary portion (that is, the non vapor deposition region). The present embodiment, even if it uses such a shielding plate, can simply fix the shielding plate, and can thus have a simple structure.

The present embodiment, which uses a vapor deposition source 85 that is equal in size to the shadow mask, does not require a planar evaporation source that is equal in size to the substrate. Further, the present embodiment simply needs to control uniformity in evaporation distribution along only the direction perpendicular to the substrate scanning direction.

In addition, the present embodiment does not need to, as conventional, switch ON/OFF a vapor deposition source that is equal in size to the substrate, and thus has an improved processing efficiency.

The present embodiment is arranged such that the mask unit 80 is fixedly placed in the vacuum chamber 60. The present embodiment is, however, not limited to such an arrangement.

The vapor deposition device 50 may include, instead of the substrate moving mechanism 70, (i) a substrate holding member 71 (for example, an electrostatic chuck) for fixing the film formation substrate 200 and (ii) a mask unit moving mechanism (mask unit moving means) for moving the mask unit relative to the film formation substrate 200 while maintaining the respective positions of the shadow mask 81 and the vapor deposition source 85 relative to each other. The vapor deposition device 50 may alternatively include both the substrate moving mechanism 70 and a mask unit moving mechanism.

In other words, the film formation substrate 200 and the mask unit 80 simply need to be so provided that at least one of them is moveable relative to the other. The advantages of the present invention can be achieved regardless of which of the film formation substrate 200 and the mask unit 80 is arranged to move.

The substrate moving mechanism 70 and the mask unit moving mechanism may each be, for example, a roller-type moving mechanism or a hydraulic moving mechanism.

In the case where the mask unit 80 is moved relative to the film formation substrate 200 as described above, the mask unit 80 is arranged, for example, such that the shadow mask 81 and the vapor deposition source 85 are moved, relative to the film formation substrate 200, together with the mask holding member 87 (for example, an identical holder). This arrangement makes it possible to move the mask unit 80 relative to the film formation substrate 200 while maintaining the respective positions of the shadow mask 81 and the vapor deposition source 85 relative to each other.

In the case where the mask unit 80 is moved relative to the film formation substrate 200 as described above, the shadow mask 81 and the vapor deposition source 85 are preferably so held by, for example, an identical holder (holding member; holding means) as to be integrated with each other.

In the case where the film formation substrate 200 is moved relative to the mask unit 80 as described above, the shadow mask 81 and the vapor deposition source 85 simply need to be fixed in position relative to each other, but do not necessarily need to be integrated with each other.

The mask unit 80 may be arranged, for example, such that (i) the vapor deposition source 85 is fixed to, for example, a bottom wall among inner walls of the vacuum chamber 60, (ii) the mask holding member 87 is fixed to one of the inner walls of the vacuum chamber 60, and consequently (iii) the shadow mask 81 and the vapor deposition source 85 are fixed in position relative to each other.

The present embodiment describes an example case in which the openings 82 of the shadow mask 81 are aligned with the emission holes 86 of the vapor deposition source 85 so that the emission holes 86 are each positioned inside one of the openings 82 in a plan view and that the openings 82 are provided in a one-to-one correspondence with the emission holes 86. The present embodiment is, however, not limited to such an arrangement. The openings 82 do not necessarily need to be provided (i) to face the emission holes 86 or (ii) in a one-to-one correspondence with the emission holes 86.

Specifically, the openings 82 may each have a pitch p that is unequal to the pitch of an emission hole 86. Further, the widths d5 and d6 of an opening 82 do not need to match the opening width (opening diameter) of an emission hole 86. For example, in the example illustrated in FIG. 1, the emission holes 86 may each have an opening diameter that is larger or smaller than the width d6 of an opening 82. In addition, a plurality of emission holes 86 may be provided to correspond to a single opening 82, whereas a single emission hole 86 may be provided to correspond to a plurality of openings 82. Further, a part (that is, at least one) of a plurality of emission holes 86 or a partial region of an emission hole 86 may be provided to face a non-opening section (that is, a region of the shadow mask 81 which region is other than the openings 82; for example, a region between openings 82 and 82).

To reduce the number of vapor deposition particles adhering to a non-opening section of the shadow mask 81 and thus improve material use efficiency as much as possible, the emission holes 86 are preferably provided to face the openings 82 in such a manner that at least a portion (that is, at least a partial region) of each emission hole 86 coincides with one or more openings 82. Further, the emission holes 86 are more preferably provided to (i) face the openings 82 and (ii) be each positioned inside one of the openings 82 in a plan view.

The present embodiment describes an example case in which both the openings 82 of the shadow mask 81 and the emission holes 86 of the vapor deposition source 85 are arranged one-dimensionally. The present embodiment is, however, not limited to such an arrangement. The openings 82 of the shadow mask 81 and the emission holes 86 of the vapor deposition source 85 simply need to be provided to face each other, and may thus be arranged two-dimensionally.

The present embodiment describes an example case involving a plurality of openings 82 in the shadow mask 81 and a plurality of emission holes 86 in the vapor deposition source 85. The present embodiment is, however, not limited to such an arrangement. The shadow mask 81 simply needs to include at least one opening 82, whereas the vapor deposition source 85 simply needs to include at least one emission hole 86.

In other words, the present embodiment may alternatively be arranged such that the shadow mask 81 includes only one opening 82 and that the vapor deposition source 85 includes only one emission hole 86. Even this arrangement makes it possible to form a predetermined pattern on the film formation substrate 200 by (i) moving at least one of the mask unit 80 and the film formation substrate 200 relative to the other and (ii) sequentially depositing vapor deposition particles onto the vapor deposition region 210 of the film formation substrate 200 through the opening 82 of the shadow mask 81.

The present embodiment describes an example case in which the shadow mask 81 includes slit-shaped openings 82. The shape of the openings 82 can, however, be simply set as appropriate to form a desired vapor deposition pattern, and is thus not particularly limited to any specific one.

The present embodiment describes an example case in which the substrate moving mechanism 70 includes an electrostatic chuck as the substrate holding member 71. Using the electrostatic chuck to hold the film formation substrate 200 as described above can effectively prevent self-weight bending of the film formation substrate 200.

The present embodiment is, however, not limited to such an arrangement. Depending on the size of the film formation substrate 200, the substrate holding member 71 may be, for example, a holding member such as a roller for applying tension to the substrate to mechanically sandwich and hold it.

The present embodiment describes an example case involving, as the shutter 89, a shutter capable of moving in a space between the shadow mask 81 and the vapor deposition source 85. The present embodiment is, however, not limited to such an arrangement. The present embodiment may alternatively be arranged, for example, such that (i) the vapor deposition source 85 is a vapor deposition source 85 that can be switched ON/OFF and that (ii) when a portion of the film formation substrate 200 which portion needs no vapor deposition is positioned in a region (that is, a region facing an opening 82) that faces an opening region of the shadow mask 81, vapor deposition is turned OFF so that no vapor deposition molecules fly.

The present embodiment may alternatively be arranged, for example, such that the shutter 89 is a shutter 89 provided to the vapor deposition source 85 and serving to close the emission holes 86 of the vapor deposition source 85 to block emission (release) of vapor deposition particles.

The present embodiment may further alternatively be arranged such that instead of providing the shutter 89 to the emission holes 86, the vapor deposition source 85 is switched ON/OFF on the basis of a vapor deposition ON signal or a vapor deposition OFF signal to stop the generation itself of vapor deposition particles.

Regardless of the arrangement, the present embodiment, which uses a shadow mask 81 with an area smaller than the substrate area and integrates the shadow mask 81 and the vapor deposition source 85 with each other as described above, (i) eliminates the need to, as conventional, carry out ON/OFF control of a part of a plurality of vapor deposition sources (or emission holes) and (ii) simply needs to turn ON or OFF the vapor deposition source 85 itself, that is, all emission holes 86, for a non vapor deposition region. The present embodiment thus requires no complicated mechanism, and consequently allows ON/OFF control to be easily carried out.

The present embodiment describes an example method for producing, as described above, an organic EL display device 1 of the bottom emission type, which extracts light from the TFT substrate 10 side. The present embodiment is, however, not limited to such production. The present invention is also suitably applicable to an organic EL display device 1 of a top emission type, which extracts light from the sealing substrate 40 side.

The present embodiment describes an example case that uses a glass substrate as a supporting substrate for each of the TFT substrate 10 and the sealing substrate 40. The present embodiment is, however, not limited to such an arrangement.

The respective supporting substrates for the TFT substrate 10 and the sealing substrate 40 may, for example, each be, other than a glass substrate, a transparent substrate such as a plastic substrate in the case where the organic EL display device 1 is an organic EL display device of the bottom emission type. In the case where the organic EL display device 1 is an organic EL display device of the top emission type, the respective supporting substrates may, for example, each be an opaque substrate such as a ceramics substrate other than the above transparent substrate.

The present embodiment describes an example case involving an anode (in the present embodiment, the first electrode 21) formed in a matrix. The anode is, however, not particularly limited in terms of shape, material, or size as long as it has the function as an electrode for supplying positive holes to an organic EL layer. The anode may have, for example, a stripe shape. By the nature of an organic EL element, at least one of the anode and the cathode is preferably transparent. An organic EL element typically includes a transparent anode.

The present embodiment is not limited by the above values of the scan rate, the vapor deposition rate, and the number of reciprocating scans for the TFT substrate 10. Adjusting the above values makes it possible to achieve a desired film thickness in a desired tact time.

The present embodiment is also not limited by the above values of (i) the gap g1 between the TFT substrate 10 serving as the film formation substrate 200 and the shadow mask 81 and (ii) the gap g2 between the vapor deposition source 85 and the shadow mask 81.

The gap g2 between the vapor deposition source 85 and the shadow mask 81 may be adjusted as appropriate in consideration of (i) distribution of, for example, spatial spread of vapor deposition particles and (ii) influence of heat radiated from the vapor deposition source 85.

Embodiment 2

The present embodiment is described below mainly with reference to (b) of FIG. 2 and FIGS. 19 through 23.

The present embodiment mainly deals with how the present embodiment differs from Embodiment 1 above.

Constituent elements of the present embodiment that are identical in function to their respective equivalents described in Embodiment 1 are each assigned the same reference numeral, and are not described here.

Embodiment 1 above deals with a case that involves simultaneously scanning the TFT substrate 10 and carrying out an alignment between the TFT substrate 10 and the shadow mask 81. The present invention is, however, not limited to such an arrangement. The present invention may alternatively be arranged such that a sufficient alignment is carried out before a substrate scan and that no alignment is carried out during the scan. Such a case does not require the alignment markers 221 to be provided along a side of the vapor deposition region 210 of the film formation substrate 200 (see FIG. 19), and may instead be provided at, for example, the four corners of the film formation substrate 200.

The present embodiment further differs from Embodiment 1 in that as illustrated in (b) of FIG. 2, the shadow mask 81 has depressed portions 81c (depressions) at an end surface that comes into contact with an end surface of each protruding partition wall 26 so provided as to protrude from a formation surface in the vapor deposition region of the TFT substrate 10. (b) of FIG. 2 is a view schematically illustrating another example configuration of the portion E in FIG. 1. The shadow mask 81 is, in other words, smaller in thickness at portions that come into contact with the partition walls 26 than the other portions. The respective shapes of the partition walls 26 and the depressed portions 81c are, needless to say, not limited to those illustrated in FIG. 2. The present embodiment may, for instance, be alternatively arranged such that an end surface of each partition wall 26 is depressed and that a corresponding end surface of the shadow mask 81 which end surface comes into contact with the partition wall 26 is protruding.

In the present embodiment, the depressed portions 81c each have a depth of 10 μm and a width of 40 μm. The partition walls 26 each have a width of approximately 26 μm at a contact portion, which leaves a void of approximately 14 μm in total between each depressed portion 81c of the shadow mask 81 and a corresponding partition wall 26. The depressed portions 81c can be easily formed in the shadow mask 81 by photolithography and adjustment of the etching period.

With the above arrangement, placing the film formation substrate 200 and the shadow mask 81 in contact with each other at the partition walls 26 causes the partition walls 26 to engage with the depressed portions 81c. This eliminates the need to carry out an alignment as a separate step, and thus prevents the vapor deposition device from becoming complex and tact time from increasing.

With reference to FIG. 20, the description below deals with, among all the steps of the present embodiment, steps different from those of Embodiment 1. Specifically, the description below deals with, as an example, a method for forming on the TFT substrate 10 a pattern of an organic EL layer including a hole injection layer/hole transfer layer 22 and luminous layers 23.

After carrying out an adjustment of the position of the shadow mask 81 as in Embodiment 1, the method inserted the TFT substrate 10 in the vacuum chamber 60 and carried out an adjustment with use of the alignment markers 84 of the shadow mask 81 and the alignment markers 221 of the TFT substrate 10 so that each pixel column of an identical color of the TFT substrate 10 had a direction that was identical to the substrate scanning direction. The method then placed the shadow mask 81 and the TFT substrate 10 on top of each other at an end of the TFT substrate 10, and at that portion, placed the shadow mask 81 and the TFT substrate 10 in contact with each other at the partition walls 26. The method, in the above step, caused the partition walls 26 to engage with respective depressed portions 81c of the shadow mask 81 as illustrated in (a) of FIG. 20. In other words, the partition walls 26 are in contact with the shadow mask 81 at depressed portions 81c thereof.

The method next scanned the TFT substrate 10 at 30 mm/s, and while keeping the TFT substrate 10 and the shadow mask 81 in contact with each other, carried out a substrate scan in such a manner that the TFT substrate 10 passed through a position directly above the shadow mask 81. The method, in the above step, carried out no particular alignment between the TFT substrate and the shadow mask during vapor deposition. When the TFT substrate 10 passed through a position directly above the shadow mask 81, vapor deposition particles scattered from the vapor deposition source 85 were adhered to a desired position on the TFT substrate 10 through the openings 82 of the shadow mask 81. When the TFT substrate 10 had completely passed through the position directly above the shadow mask 81, there was adhered to the TFT substrate 10 the material of the hole injection layer/hole transfer layer with a film thickness of 15 nm.

The present embodiment then reversed the scanning direction of the TFT substrate 10, and deposited the material of the hole injection layer/hole transfer layer at an identical position by a method similar to above method. This formed a hole injection layer/hole transfer layer having a film thickness of 30 nm.

A similar method was used to form a pattern of the luminous layers 23. This method used a shadow mask 81 illustrated in (b) of FIG. 20 for vapor deposition of a red luminous layer 23R. This shadow mask has depressed portions formed in correspondence with all the partition walls 26, but has openings for only red pixel columns.

The other steps are similar to respective corresponding steps of Embodiment 1.

The above steps completed production of an organic EL display device 1 including respective patterns of the hole injection layer/hole transfer layer 22 and the luminous layers 23.

The above arrangement of the present embodiment causes the depressed portions 81c of the shadow mask 81 to engage with the partition walls 26. Thus, the above arrangement, even if no particular alignment was carried out between the TFT substrate 10 and the shadow mask 81 for vapor deposition, prevented color mixture from occurring due to a shift in position of the TFT substrate 10 and the shadow mask 81, and successfully carried out vapor deposition onto only a desired position.

The present embodiment carried out no alignment between the TFT substrate 10 and the shadow mask 81 for vapor deposition. The present embodiment is, however, not limited to such an arrangement, and may simultaneously carry out an alignment while carrying out a scan as in Embodiment 1. This arrangement not only causes the depressed portions 81c of the shadow mask 81 to effectively engage with the partition walls 26, but also simultaneously carries out an alignment between the TFT substrate 10 and the shadow mask 81 with use of an alignment mechanism. This allows a more precise alignment to be carried out. Further, the above arrangement allows a rough alignment to be carried out by causing the depressed portions 81c of the shadow mask 81 to engage with the partition walls 26. With the above arrangement, only fine-tuning is required for an alignment between the TFT substrate 10 and the shadow mask 81 with use of an alignment mechanism. The above arrangement thus further effectively simplifies the alignment mechanism or allows it to be produced more inexpensively.

The above arrangement of the present embodiment eliminates the need to carry out an alignment for vapor deposition, and thus merely requires the shadow mask 81 and the partition walls 26 on the TFT substrate 10 to be simply in contact with each other. The contact surface is not limited in shape, and may be curved, for example. Pressing the shadow mask 81 toward the surface of the TFT substrate 10 allows a mask surface to easily follow a substrate surface. This arrangement thus allows the advantages of the present invention to be achieved even with use of a glass substrate of any thickness or any of various flexible substrates (for example, a thin plastic substrate).

The present embodiment includes, instead of a tension mechanism, a mask pressing mechanism 88' for the shadow mask 81 as illustrated in FIG. 21. The present embodiment is, needless to say, not limited to such a configuration, and may use any other mask holding method or include a tension mechanism. In the case where the present embodiment includes a tension mechanism, the present embodiment simply needs to appropriately adjust tension, to be applied to the shadow mask 81, so that the partition walls 26 on the TFT substrate 10 and the shadow mask 81 are in contact with each other throughout the TFT substrate 10. Further, in the case where the present embodiment adjusts the position of the shadow mask 81 with use of an alignment mechanism such as the above for vapor deposition, such an adjustment is more preferably carried out with a tension mechanism applying tension to the shadow mask.

In the present embodiment, the depressed portions 81c of the shadow mask 81 each have a rectangular (vertical) edge section. The present embodiment is, however, not limited to such an arrangement. The depressed portions 81c may each have any of various shapes as long as the depressed portions 81c and the partition walls 26 can engage with each other in structure. The partition walls 26 may similarly each have any of various shapes.

FIG. 22 shows diagrams each illustrating example shapes of the depressed portions 81c of the shadow mask 81 and the partition walls 26. These structures can each be easily prepared under such process conditions as (i) photolithography (for example, double exposure) and (ii) wet or dry etching. (b) of FIG. 22 illustrates both wall surfaces of the depressed portions 81c and wall surfaces of the partition walls 26 as having a reverse tapered shape. The reverse tapered shape of the wall surfaces of the depressed portions 81c refers to a state in which the wall surfaces each have a protruding portion that forms an angle of larger than 90° with respect to the depressed portion 81c. The shape illustrated in (b) of FIG. 22 causes the depressed portions 81c of the shadow mask 81 to be stuck with the partition walls 26, and thus increases contact force between the shadow mask 81 and the partition walls 26. With this shape, when the shadow mask 81 is first brought into contact with the partition walls 26, simply pressing the shadow mask 81 against the TFT substrate 10 cannot cause the depressed portions 81c to be stuck as above. Thus, when the shadow mask 81 is first brought into contact with the partition walls 26, the present embodiment can simply widen the depressed portions 81c of the shadow mask 81 or narrow the partition walls 26 to prevent the depressed portions 81c from being stuck. A later scan can cause the depressed portions 81c of the shadow mask 81 to be stuck with the partition walls 26.

In addition, the shape illustrated in (c) of FIG. 22 can further prevent misplacement between the shadow mask 81 and the TFT substrate 10.

FIG. 23 illustrates a case in which (i) the depressed portions 81c of the shadow mask 81 each have a wall surface in a forward tapered shape and (ii) the partition walls 26 each have a wall surface in a forward tapered shape. In this case, even if the TFT substrate 10 and the shadow mask 81 have been shifted in position as illustrated in (a) of FIG. 23, pressure so applied as to bring the TFT substrate 10 and the shadow mask 81 into contact with each other at the partition walls 26 (indicated by the arrows in (b) of FIG. 23) causes the wall surfaces of the depressed portions 81c and those of the partition walls 26 to slide along each other, and consequently allows force to act in such a direction as to correct the misplacement. This indicates that the forward tapered structure of the wall surfaces is effective in preventing misplacement.

The structure of the present embodiment allows the TFT substrate and the shadow mask to be closer to each other by a distance equal to the depth of the depressed portions 81c of the shadow mask 81. This arrangement can reduce the amount of material adhering to the wall surfaces of the partition wall 26, and thus increase material use efficiency and vapor deposition rate.

Embodiment 3

The present embodiment is described below with reference to FIG. 24.

Figure 24:
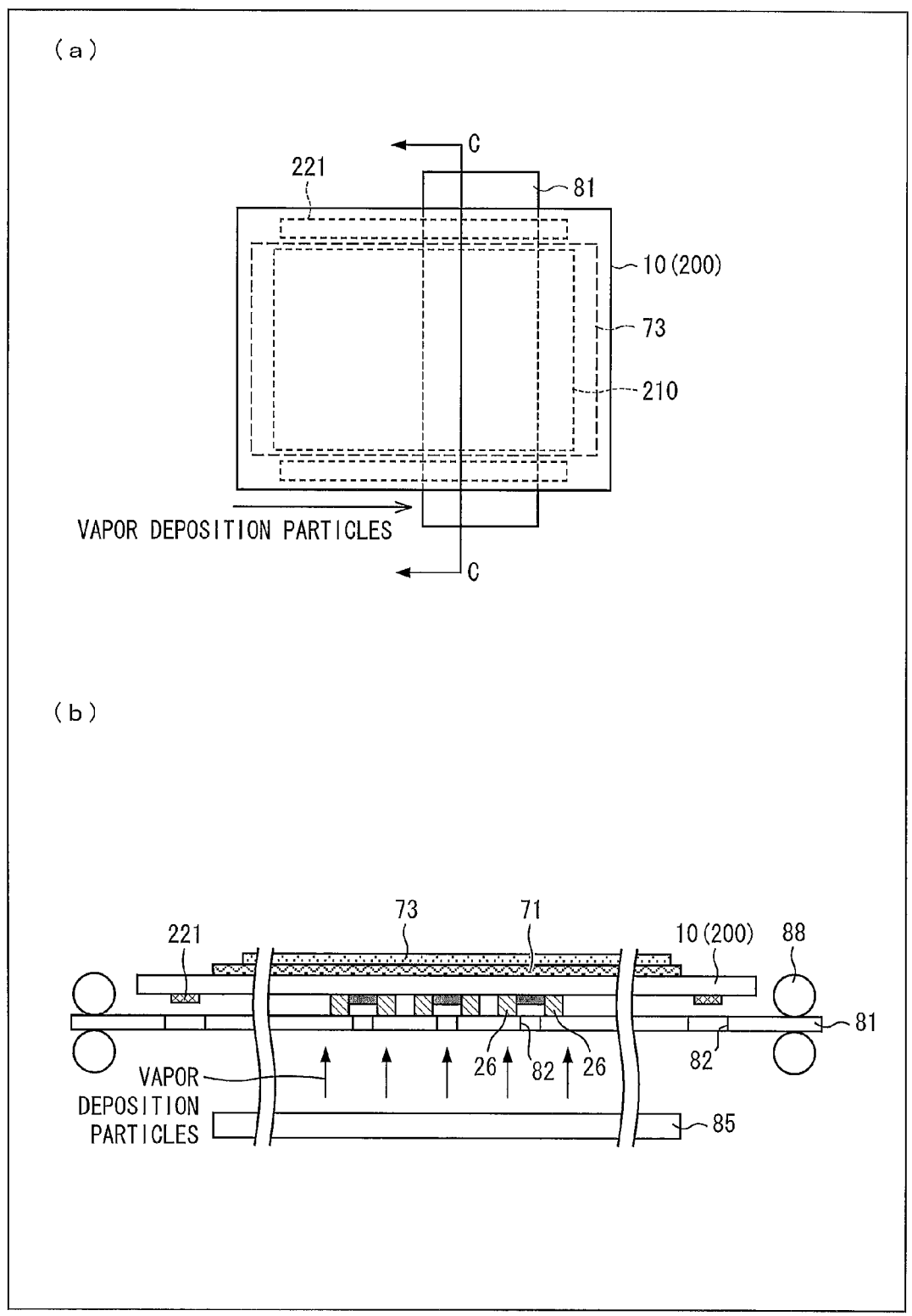
Figure 27:
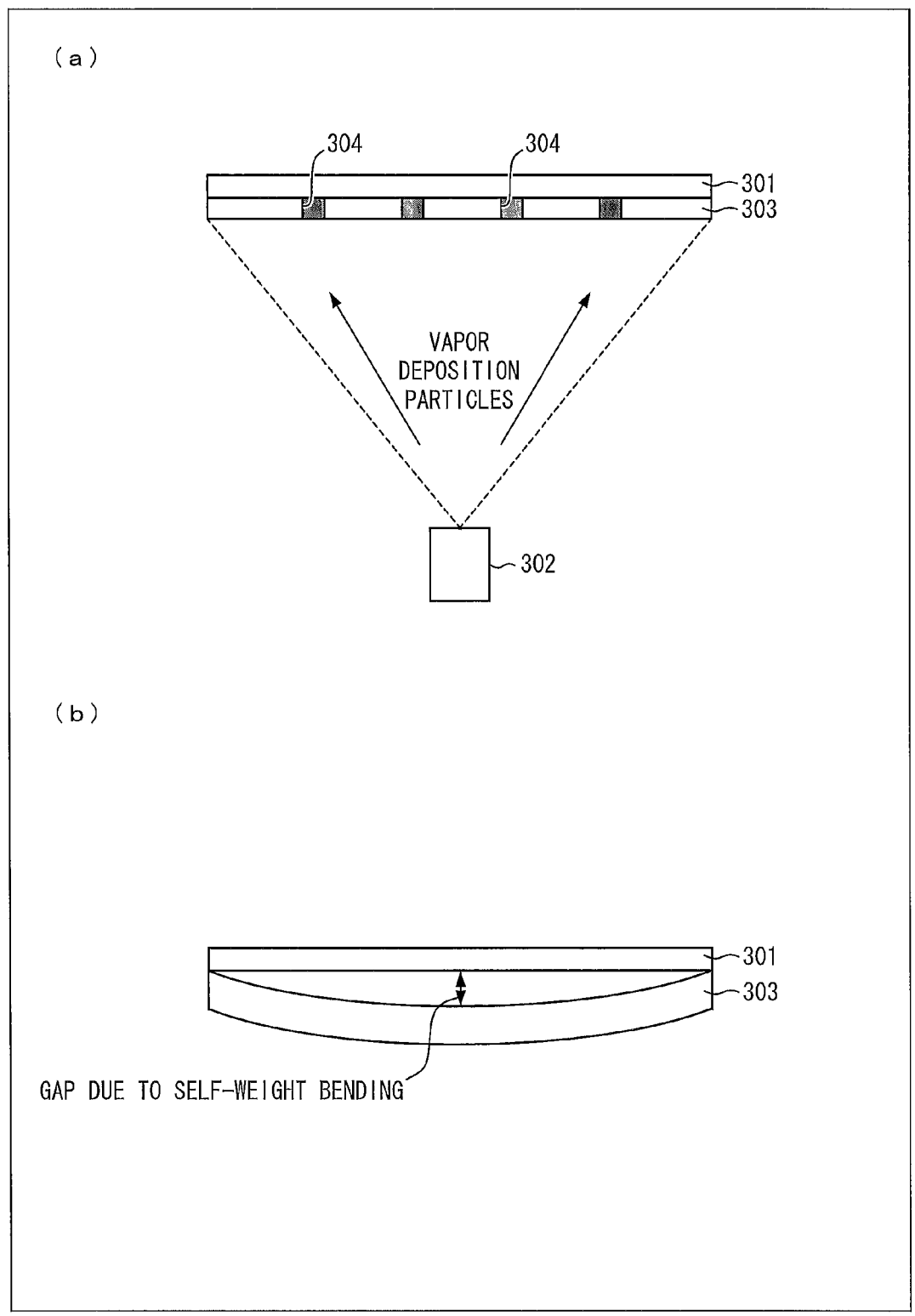

(a) of FIG. 24 is a plan view schematically illustrating other example configurations of a TFT substrate 10 substrate and a shadow mask 81 both contained in a vacuum chamber of a vapor deposition device of the present embodiment. (b) of FIG. 24 is a cross-sectional view taken along line C-C in (a) of FIG. 24.

The present embodiment differs from Embodiments 1 and 2 in that it includes a magnet 73 (contacting means) on a back surface of the TFT substrate 10 as illustrated in FIG. 24. Specifically, the present embodiment, as illustrated in (b) of FIG. 24, includes a magnet 73 on an electrostatic chuck serving as the substrate holding member 71. The present embodiment uses a magnetic shadow mask 81 (made of, for example, an invar material or a particular type of SUS), which is subjected to an attraction force of the magnet 73.

The present embodiment prepared an organic EL display device through a vapor deposition procedure similar to that of Embodiment 1.

The present embodiment includes a magnet 73 on the back surface of the TFT substrate 10. This arrangement causes the shadow mask 81 to be attracted toward the TFT substrate 10 side by a magnetic force when the shadow mask 81 is close to or overlaps the magnet 73 in a plan view during a scan of the TFT substrate 10. The above arrangement thus further increases adhesion between the partition walls 26 and the shadow mask 81. This adhesion prevents a void from occurring between the TFT substrate and the shadow mask due to vibration and bending during a scan. This consequently prevents color mixture from occurring due to vapor deposition particles entering a region other than a desired pixel region. The above void refers to a gap between the uppermost portions of the respective partition walls 26 and the shadow mask 81.

The present embodiment includes a mask tension mechanism 88, but may instead include a mask pressing mechanism 88' or use another mask holding method as in Embodiment 2.

Embodiment 4

The present embodiment is described below with reference to FIGS. 25 and 26.

FIG. 25 is a plan view schematically illustrating still other example configurations of a TFT substrate 10 substrate and a shadow mask 81 both contained in a vacuum chamber of a vapor deposition device of the present embodiment. The present embodiment differs from Embodiment 3 in that (i) it includes a magnet 73 on a back surface of the TFT substrate 10 only at a position directly above the shadow mask 81 and that (ii) the magnet 73 is divided into a plurality of portions arranged along a substrate scanning direction. The divided magnets 73 are each an electromagnet, and are each independently capable of being switched on or off for generation of a magnetic force. The vapor deposition device of the present embodiment has a cross section identical to that illustrated in (b) of FIG. 24. Specifically, the magnets 73 are provided on an electrostatic chuck serving as the substrate holding member 71.

The present embodiment, however, differs from Embodiment 3 in that the magnets 73 are not scanned together with the TFT substrate 10. (However, in the case where the shadow mask 81 side is scanned, the magnets 73 are scanned together with the shadow mask 81.) Thus, the electrostatic chuck serving as the substrate holding member 71 slides on the magnets 73 during a substrate scan. The present embodiment uses a magnetic shadow mask 81 (made of, for example, an invar material or a particular type of SUS), which is subjected to an attraction force of the magnet 73.

The present embodiment carries out a vapor deposition procedure as in Embodiment 1, but applies a magnetic force during the vapor deposition procedure as illustrated in FIG. 26. Specifically, when only a single line of the magnets 73 overlaps the TFT substrate 10 as illustrated in (a) of FIG. 26, that single line is switched on to generate a magnetic force whereas the other lines are switched off.

Then, when the TFT substrate 10 has been scanned and two lines of the magnets 73 overlap the TFT substrate as illustrated in (b) of FIG. 26, only those two lines are switched on. The magnets 73 are each switched on to generate a magnetic force only when the TFT substrate 10 is present between the shadow mask 81 and the magnet 73 as described above. Similarly, when the TFT substrate 10 has finished passing over the shadow mask 81, any magnet 73 in a region in which the TFT substrate 10 is not present between the shadow mask 81 and the magnet 73 is switched off to generate no magnetic force.

The present embodiment prepared an organic EL display device through a procedure as described above.

The present embodiment is arranged such that (i) when a magnet 73 is switched on to generate a magnetic force, the TFT substrate 10 is always present between the shadow mask 81 and that magnet 73 and that (ii) the above magnetic force attracts the shadow mask 81 toward the TFT substrate 10 for contact. The present embodiment can thus achieve advantages similar to those achieved by Embodiment 3.

According to the present embodiment, the magnets 73 are provided in only (i) a region directly above the shadow mask 81 or (ii) a region surrounding the above region. This arrangement can prevent the magnets 73 from functionally or physically (positionally) interfering with any other mechanism provided for a TFT substrate. Further, the present embodiment merely requires small magnets 73 provided directly above the shadow mask 81, and can thus reduce influence of a property variation among the magnets 73.

The present embodiment switches on a magnet 73 for generation of a magnetic force when the TFT substrate 10 is present directly above that magnet 73. The present embodiment is, however, not limited in timing of the switch. The present embodiment may alternatively be arranged, for instance, such that a magnet 73 is not switched on to generate a magnetic force when the TFT substrate 10 is present directly above it, but is switched on when a vapor deposition region or a region close thereto has moved to a position directly above the magnet 73. Further, the present embodiment may, even in the state in which the TFT substrate 10 still remains between the shadow mask 81 and a magnet 73, switch off that magnet 73 to generate no magnetic force if there is no need to apply a magnetic force to bring the shadow mask 81 into contact with the partition walls on the TFT substrate 10.

Although not particularly describing such an arrangement, the present embodiment, which has a mechanism that causes the electrostatic chuck to slide on surfaces of the magnets, may have a structure that reduces friction between the electrostatic chuck and the surfaces. For instance, either the magnets or the electrostatic chuck may have a large number of hemispheric protruding structures (not shown; contact area reducing structures) provided on a surface. Such structures can reduce the area of contact between the magnets and the electrostatic chuck, and thus reduce friction therebetween. Alternatively, the magnets and the electrostatic chuck may each have a contact surface treated to reduce friction. Further alternatively, there may be a void between the magnets 73 and the electrostatic chuck to prevent friction therebetween. As is clearly understood, the above problem of friction can occur similarly even in the case where a substrate holding method or a member other than the electrostatic chuck replaces it and comes into contact with the magnets.

While the vapor deposition method described in the above embodiments each carry out vapor deposition by depo-up, the above embodiments may each be arranged such that (i) the vapor deposition source 85 is provided above the TFT substrate 10 (film formation substrate 200) and that (ii) vapor deposition particles pass through the openings 82 of the shadow mask 81 to be deposited onto the film formation substrate 200 downward from above (that is, down deposition; hereinafter referred to as "depo-down").

The present invention may alternatively be arranged such that (i) the vapor deposition source 85 includes a mechanism for emitting vapor deposition particles in a lateral direction and that (ii) such vapor deposition particles are deposited (side deposition) onto the film formation substrate 200 in a lateral direction through the shadow mask 81 in a state in which the film formation substrate 200 is stood vertically in such a manner that the vapor deposition surface (film formation surface) thereof faces the vapor deposition source 85 side.

The embodiments above each describe an example case in which (i) the organic EL display device 1 includes a TFT substrate 10 and (ii) an organic layer is formed on the TFT substrate 10. The present invention is, however, not limited to such an arrangement. The present invention may alternatively be arranged such that (i) the organic EL display device 1 includes not a TFT substrate 10 but, as a substrate on which an organic layer is to be formed, a passive substrate including no TFT, or that (ii) the film formation substrate 200 is such a passive substrate.

The embodiments above each describe an example case of, as described above, forming an organic layer on a TFT substrate 10. The present invention is, however, not limited to such an arrangement. The present invention is suitably applicable to a case of forming an electrode pattern instead of an organic layer. The vapor deposition device 50 and vapor deposition method of the present invention are, as described above, suitably applicable to, other than the method for producing the organic EL display device 1, any production method and production device for forming a patterned film by vapor deposition.

<Main Points>

As described above, the vapor deposition device of each of the above embodiments is a vapor deposition device for forming, on a film formation substrate on which the film is to be formed, a film having a predetermined pattern, the film formation substrate having a partition wall that has a predetermined height and that stands between film formation regions on the film formation substrate, the vapor deposition device including: a mask unit provided so as to face the film formation substrate and so as to include: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other; contacting means for bringing the film formation substrate and the vapor deposition mask into contact with each other at the partition wall; and moving means for moving at least a first one of the mask unit and the film formation substrate relative to a second one thereof in a state in which the vapor deposition mask and the film formation substrate are in contact with each other at the partition wall.

As described above, the vapor deposition method of each of the above embodiments is a vapor deposition method for forming, on a film formation substrate on which the film is to be formed, a film having a predetermined pattern, the vapor deposition method including: a partition wall forming step of forming, on the film formation substrate, a partition wall having a predetermined height and standing between film formation regions on the film formation substrate; a contacting step of (i) preparing a mask unit including: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other, and (ii) bringing the vapor deposition mask and the film formation substrate into contact with each other at the partition wall; and a vapor deposition step of (i) moving at least a first one of the mask unit and the film formation substrate relative to a second one thereof in a state in which the vapor deposition mask and the film formation substrate are in contact with each other at the partition wall and (ii) sequentially depositing the vapor deposition particle onto the vapor deposition region of the film formation substrate through the opening of the vapor deposition mask.

The vapor deposition device and vapor deposition method above are each different from conventional art in that the vapor deposition mask and the film formation substrate are not fixed to each other and that the vapor deposition mask and the vapor deposition source are fixed in position relative to each other. This makes it possible to carry out vapor deposition by (i) using, as described above, a vapor deposition mask smaller in area than the vapor deposition region of the film formation substrate and (ii) moving at least a first one of the mask unit and the film formation substrate relative to a second one thereof.

Further, a partition wall having a predetermined height is provided to stand between film formation regions on the film formation substrate, and the vapor deposition mask and the film formation substrate are brought into contact with each other at the partition wall.

The arrangements above each thus prevent the problem of, for example, self-weight bending and elongation due to a large-sized vapor deposition mask, and consequently make it possible to not only form a pattern of an organic layer on a large-sized substrate, but also form such a pattern with high positional accuracy and high resolution. The arrangements above each prevent the film formation substrate from coming into direct contact with the vapor deposition mask, and thus prevent the vapor deposition mask from damaging the film formation substrate. The arrangements above, each further including a partition wall having a predetermined height and standing between film formation regions on the film formation substrate, prevent vapor deposition particles from being scattered to an adjacent film formation region during vapor deposition, and can thus reliably prevent vapor deposition particles from being undesirable scattered to an adjacent pixel to cause color mixture or property impairment.

The present invention can carry out vapor deposition by moving at least a first one of the mask unit and the film formation substrate relative to a second one thereof while there is a fixed partition wall between the mask unit and the film formation substrate, and thus form a film formation pattern (vapor deposition film) that is uniform in width and film thickness.

The vapor deposition device and the vapor deposition method each use a vapor deposition mask smaller in area than the vapor deposition region of the film formation substrate as described above. This can reduce or prevent problems caused by a frame for holding a vapor deposition mask which frame is extremely large and extremely heavy due to a large-sized vapor deposition mask.

The above embodiments can each provide (i) a vapor deposition method and a vapor deposition device each of which makes it possible to form a vapor deposition pattern on a large-sized substrate and (ii) a method for producing an organic EL display device.

The vapor deposition device may preferably be arranged such that the vapor deposition mask includes an engaging section for engaging with the partition wall.

For instance, the vapor deposition device may be arranged such that the partition wall has a cross section in a protruding shape; and the engaging section has a cross section in a depressed shape, or such that the partition wall has a cross section in a depressed shape; and the engaging section has a cross section in a protruding shape. Further, the vapor deposition device may be arranged such that the wall surface of the partition wall is in a forward tapered shape; and the wall surface of the engaging section is in a reverse tapered shape toward the film formation substrate, or such that the wall surface of the partition wall is in a reverse tapered shape; and the wall surface of the engaging section is in a forward tapered shape toward the film formation substrate.

The above arrangement causes the engaging section of the vapor deposition mask to come into contact with the partition wall, which facilitates alignment between the vapor deposition mask and the film formation substrate. With the above arrangement, misplacement and the like can be corrected by, for example, (i) engagement of a protruding member with a corresponding depressed member or (ii) engagement of a member in a forward tapered shape with a member in a corresponding forward tapered shape. The above arrangement thus eliminates the need to separately use an aligning means in carrying out vapor deposition while moving at least a first one of the mask unit and the film formation substrate relative to a second one thereof. The above arrangement consequently prevents the vapor deposition device from becoming complex and tact time from increasing.

The vapor deposition device may preferably be arranged such that the partition wall is provided in a stripe shape along a direction in which the moving means moves the at least the first one of the mask unit and the film formation substrate relative to the second one thereof.

With the above arrangement, when vapor deposition is carried out while at least a first one of the mask unit and the film formation substrate is moved relative to a second one thereof, the partition wall achieves the effect of aligning the mask unit and the film formation substrate with each other along the direction of their relative movement.

The vapor deposition device may preferably be arranged such that the partition wall includes a plurality of discontinuous partition walls. Further, the vapor deposition device may preferably be arranged such that the partition wall is provided in such a pattern that no straight line passing through a discontinuous portion of the partition wall passes over a pixel light-emitting region of the film formation substrate.

With the above arrangement, even if the second electrode provided along the partition wall has lost electrical connection at a wall surface of the partition wall, such electrical connection can be achieved through a discontinuous portion of the partition wall. In other words, in the case where a plurality of discontinuous partition walls are provided, a current flows through a mesh-shaped path, which can in turn prevent an increase in the resistance of the second electrode.

Further, no straight line passing through a discontinuous portion of the partition wall passes over a pixel light-emitting region of the film formation substrate. With such an arrangement, even if some vapor deposition particles have passed through a discontinuous portion and entered an adjacent pixel, such vapor deposition particles will not adhere to a light-emitting region of another pixel. The above arrangement thus prevents color mixture.

The vapor deposition device may preferably be arranged such that the contacting means is a magnet provided on a first surface of the film formation substrate, the first surface being opposite to a second surface of the film formation substrate which second surface faces the vapor deposition mask. Further, the vapor deposition device may preferably be arranged such that the magnet is provided at such a position as to correspond to the vapor deposition mask.

With the above arrangement, the magnetic force of the magnet serving as the contacting means causes the vapor deposition mask to come into contact with the partition wall standing on the film formation substrate. Further, providing the magnet at such a position as to face the vapor deposition mask causes the vapor deposition mask to be attracted toward the film formation substrate. This increases force of contact between the film formation substrate and the vapor deposition mask. This contact force in turn prevents a void from occurring between the film formation substrate and the vapor deposition mask due to vibration and bending during the relative movement. This consequently prevents color mixture from occurring due to vapor deposition particles entering a region other than a desired pixel region.

The vapor deposition device may preferably be arranged such that the magnet has a controllable magnetic force.

The vapor deposition device may preferably be arranged such that the magnet includes a plurality of magnets provided along a first direction in which the moving means moves the at least the first one of the mask unit and the film formation substrate relative to the second one thereof; and the magnets each have a stripe shape extending in a second direction that is perpendicular to the first direction and that is parallel to the film formation substrate.

The vapor deposition device may preferably be arranged such that the magnetic force of the magnet is so controlled as to be applied in a case where the film formation substrate is present between the magnet and the vapor deposition mask.

The above arrangement includes a plurality of small magnets each in a stripe shape. This can reduce influence of a property variation among the magnets.

The above arrangement further makes it possible to, (i) when the film formation substrate is present between a magnet and the vapor deposition mask, switch that magnet on to generate a magnetic force and, (ii) when the film formation substrate is absent between a magnet and the vapor deposition mask, switch that magnet off to generate no magnetic force. In other words, the above arrangement causes a magnet to generate a magnetic force only when there is a need to generate a magnetic force to provide adhesion between the vapor deposition mask and the film formation substrate. This can further reduce influence of a property variation among the magnets.

The vapor deposition device may preferably be arranged such that the magnet has, on a surface in contact with the film formation substrate, a contact area reducing structure for reducing an area of contact with the film formation substrate.

The above arrangement reduces the area of contact between the magnet and the film formation substrate, and can thus reduce friction therebetween.

The vapor deposition device may preferably be arranged such that the contacting means is an electrostatic chuck that is in contact with a first surface of the film formation substrate, the first surface being opposite to a second surface of the film formation substrate which second surface faces the vapor deposition mask, and that holds the film formation substrate. The above arrangement, even in the case where the film formation substrate is large-sized, causes the film formation substrate to be attracted toward the electrostatic chuck, and can thus prevent self-weight bending.

The vapor deposition device may preferably be arranged such that the contact area reducing structure is a hemispheric protruding structure. With this arrangement, (i) the magnet comes into contact with the film formation substrate only at a point, or (ii) the electrostatic chuck comes into contact with the film formation substrate only at a point. This reduces the area of contact therebetween, and can thus reduce friction therebetween.

The vapor deposition device may preferably be arranged such that the vapor deposition mask is a rectangular vapor deposition mask that has (i) along a short-axis direction thereof, a side shorter than a width of the vapor deposition region along a side facing the short-axis direction of the vapor deposition mask and that has (ii) along a long-axis direction thereof, a side longer than a width of the vapor deposition region along a side facing the long-axis direction of the vapor deposition mask.

The above arrangement makes it possible to form alignment marker sections at, for example, respective ends of the vapor deposition mask which ends are opposite to each other along the long-side direction of the vapor deposition mask. The above arrangement thus makes it possible to carry out an alignment easily and more precisely.

The vapor deposition device may preferably further include: a first alignment marker on the film formation substrate; a second alignment marker on the vapor deposition mask; and position detecting means for carrying out an alignment between the film formation substrate and the vapor deposition mask with use of the first and second alignment markers.

The above arrangement allows an alignment to be carried out easily and precisely between the film formation substrate and the vapor deposition mask.

The vapor deposition device may preferably be arranged such that the mask unit is provided so that the emission hole faces the opening of the vapor deposition mask in a one-to-one correspondence.

The above arrangement can reduce the number of vapor deposition particles adhered to a non-opening section of the vapor deposition mask, and thus improve efficiency of material use.

The vapor deposition method may preferably be arranged such that the vapor deposition step sequentially deposits the vapor deposition particle onto the vapor deposition region of the film formation substrate while continuously moving the at least the first one of the mask unit and the film formation substrate relative to the second one thereof over the vapor deposition region of the film formation substrate.

Carrying out vapor deposition while continuously moving at least a first one of the mask unit and the film formation substrate relative to a second one thereof as described above averages the flying distribution of the vapor deposition particle along the direction of the relative movement of the film formation substrate in the case where the distribution extends along the above direction. The above arrangement thus makes it possible to form a vapor deposition film having a pattern that is uniform over the substrate surface.

The vapor deposition method may preferably be arranged such that the vapor deposition step reciprocates the at least the first one of the mask unit and the film formation substrate.

Conventional art has had the necessity to, in the case where, for example, a crucible is used as a vapor deposition source, control the film thickness by means of temperature in order to change the vapor deposition rate. This has led to, for example, (i) the problem that it takes a long time to stabilize temperature and/or (ii) the problem that a variation in temperature tends to cause instability in vapor deposition rate.

The above arrangement can, in contrast, control the film thickness by means of not temperature but the number of reciprocations. The present embodiment thus does not pose the above problems.

In particular, in the case where the above reciprocating movement is carried out to subsequently deposit the vapor deposition particle onto the vapor deposition region of the film formation substrate while continuously moving at least a first one of the mask unit and the film formation substrate relative to a second one thereof in the vapor deposition region of the film formation substrate as described above, the movement of the film formation substrate is stopped only momentarily when the direction of the relative movement of the film formation substrate is reversed, and vapor deposition is carried out even while the film formation substrate is in motion. The above arrangement thus does not require a long tact time.

The vapor deposition method may preferably be arranged such that the vapor deposition step involves stopping the emission of the vapor deposition particle from the vapor deposition source for a region of the film formation substrate, the region requiring no deposition of the vapor deposition particle.

The above arrangement, as described above, stops the emission of the vapor deposition particle from the vapor deposition source for a region of the film formation substrate, the region requiring no deposition of the vapor deposition particle. The above arrangement can thus prevent vapor deposition on a portion for which vapor deposition is unnecessary (that is, a non vapor deposition region).

The vapor deposition method may be arranged such that the predetermined pattern is an organic layer for an organic electroluminescent device. The vapor deposition method is suitably applicable to production of an organic electroluminescent device.

As described above, the method of each of the above embodiments for producing an organic electroluminescent display device includes the steps of: (a) preparing a TFT substrate on which a first electrode is provided; (b) depositing, on the TFT substrate, an organic layer including at least a luminous layer; (c) depositing a second electrode having a polarity reversed with respect to a polarity of the first electrode; and (d) sealing, with use of a sealing member, an organic electroluminescent device including the organic layer and the second electrode, the step (b) includes the partition wall forming step, the contacting step, and the vapor deposition step all included in the vapor deposition method.

The above arrangement makes it possible to not only form a pattern of an organic layer on a large-sized substrate, but also produce an organic electroluminescent display device that forms such a pattern with high positional accuracy and high resolution.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The vapor deposition device and vapor deposition method of the present invention are suitably applicable to, for example, a device and method for producing an organic EL display device which are used in a process of, for example, discriminative application formation of an organic layer for an organic EL display device.

REFERENCE SIGNS LIST

1 organic EL display device
2 pixel
2R, 2G, 2B sub-pixel
10 TFT substrate (film formation substrate)
20 organic EL element
21 first electrode
22 hole injection layer/hole transfer layer (organic layer)
23R, 23G, 23B luminous layer (organic layer)
24 electron transfer layer/electron injection layer (organic layer)
25 second electrode
26 partition wall
50 vapor deposition device 60 vacuum chamber
70 substrate moving mechanism (moving means)
71 substrate holding member (contacting means)
72 motor
73 magnet (contacting means)
80 mask unit
80R, 80G, 80B mask unit
81 shadow mask (vapor deposition mask)
81a long side
81b short side
82 opening
83 alignment marker section
84 alignment marker
85 vapor deposition source
86 emission hole
87 mask holding member (contacting means)
88 mask tension mechanism (contacting means)
88' mask pressing mechanism (contacting means)
89 shutter
90 image sensor
100 control circuit
101 image detecting section
102 computing section
103 motor drive control section
104 vapor deposition ON/OFF control section
105 shutter drive control section
200 film formation substrate
210 vapor deposition region
210a long side
210b short side
211 vapor deposition film
220 alignment marker section
221 alignment marker

The invention claimed is:

1. A method for forming, on a film formation substrate, vapor deposition films each having a predetermined pattern, the method comprising the steps of:
  (I) forming a partition wall between film formation regions on the film formation substrate, the partition wall having a cross section in a reverse tapered shape such that the portion of the wall closer to the substrate is narrower than the portion further away from the substrate, and having a predetermined height;
  (II) providing a mask unit so that the mask unit faces the film formation substrate, the mask unit including:
    (i) a vapor deposition mask that has a plurality of openings and that is smaller in area than a vapor deposition region of the film formation substrate, wherein the vapor deposition mask includes an engaging section configured to engage with the partition wall, and
    (ii) a vapor deposition source that has an emission hole configured to emit vapor deposition particles, the emission hole being provided so as to face the vapor deposition mask, the vapor deposition mask and the vapor deposition source being separated by a fixed gap, and bringing the vapor deposition mask and the film formation substrate into contact with each other at the partition wall;
  (III) depositing the vapor deposition particles onto the vapor deposition region of the film formation substrate through the opening of the vapor deposition mask while causing at least one of the vapor deposition mask and the film formation substrate to move relative to each other,
  the engaging section having a wall surface including a depressed portion, the depressed portion is tapered such that the portion closest to the substrate surface is narrower than the portion that is further from the substrate, such that the depressed portion has a shape complementary to the partition wall such that they are capable of interlocking,
  in the step (II), when the depressed portion of the vapor deposition mask is first brought into contact with the partition wall, the depressed portion of the vapor deposition mask having a larger width than a width of the partition wall or the width of the partition wall having a smaller width than the width of the depressed portion of the vapor deposition mask, so that the depressed portion of the vapor deposition mask and the partition wall are not interlocked with each other, and
  in the step (III), at least one of the vapor deposition mask and the film formation substrate being caused to move relative to each other so that the depressed portion of the vapor deposition mask and the reverse taper of the partition wall are interlocked with each other and the engaging section engages with the partition wall along a direction of the relative movement of the film formation substrate and the mask unit, and in a state where the depressed portion of the vapor deposition mask and the partition wall are interlocked with each other such that each of the respective reverse tapers are interlocked, while at least one of the mask unit and the film formation substrate is caused to move relative to each other, the vapor deposition particles being deposited onto the vapor deposition region of the film formation substrate.

2. The method according to claim 1, wherein:
the partition wall is provided in a stripe shape along the direction of the relative movement.

3. The method according to claim 2, wherein:
the partition wall includes a plurality of discontinuous partition walls.

4. The method according to claim 3, wherein:
the partition wall is provided in such a pattern that no straight line passing through a discontinuous portion of the partition wall passes over a pixel light-emitting region of the film formation substrate, the pixel light-emitting region corresponding to the respective formation regions of the vapor deposition films.

5. A method for forming, on a film formation substrate, vapor deposition films each having a predetermined pattern, the method comprising the steps of:
  (I) forming a partition wall between film formation regions on the film formation substrate, the partition wall having a cross section in a reverse tapered shape such that the portion of the wall closer to the substrate is narrower than the portion further away from the substrate, and having a predetermined height;
  (II) providing a mask unit so that the mask unit faces the film formation substrate, the mask unit including:
    (i) a vapor deposition mask that has a plurality of openings and that is smaller in area than a vapor deposition region of the film formation substrate, wherein the vapor deposition mask includes an engaging section configured to engage with the partition wall, and
    (ii) a vapor deposition source that has an emission hole configured to emit vapor deposition particles, the emission hole being provided so as to face the vapor deposition mask, the vapor deposition mask and the vapor deposition source being separated by a fixed gap, and bringing the vapor deposition mask and the film formation substrate into contact with each other at the partition wall;

(III) depositing the vapor deposition particles onto the vapor deposition region of the film formation substrate through the opening of the vapor deposition mask while causing at least one of the vapor deposition mask and the film formation substrate to move relative to each other, the engaging section having a wall surface including a depressed portion, the depressed portion is tapered such that the portion closest to the substrate surface is narrower than the portion that is further from the substrate, such that the depressed portion has a shape complementary to the partition wall such that they are capable of interlocking, in the step (II), when the depressed portion of the vapor deposition mask is first brought into contact with the partition wall, the depressed portion of the vapor deposition mask having a larger width than a width of the partition wall or the width of the partition wall having a smaller width than the width of the depressed portion of the vapor deposition mask, so that the depressed portion of the vapor deposition mask and the partition wall are not interlocked with each other, in the step (III), at least one of the vapor deposition mask and the film formation substrate being caused to move relative to each other so that the depressed portion of the vapor deposition mask and the reverse taper of the partition wall are interlocked with each other and the engaging section engages with the partition wall along a direction of the relative movement of the film formation substrate and the mask unit, and in a state where the depressed portion of the vapor deposition mask and the partition wall are interlocked with each other such that each of the respective reverse tapers are interlocked, while at least one of the mask unit and the film formation substrate is caused to move relative to each other, the vapor deposition particles being deposited onto the vapor deposition region of the film formation substrate, a magnet being provided on a first surface of the film formation substrate, the first surface being opposite to a second surface of the film formation substrate which second surface faces the vapor deposition mask, the magnet including a plurality of magnets provided along a first direction in which at least a first one of the mask unit and the film formation substrate moves relative to a second one thereof, the magnets each having a stripe shape extending in a second direction that is perpendicular to the first direction and that is parallel to the film formation substrate, the magnets being provided only at such a position as to correspond to the vapor deposition mask, in the step (III), the magnets being so controlled that in a case where the film formation substrate is present between the magnets and the vapor deposition mask, (i) only a line of magnets overlapping the film formation substrate generate a magnetic force and (ii) a line of magnets not overlapping the film formation substrate are stopped from generating a magnetic force.

6. The method according to claim 5, wherein:
the magnet has, on a surface in contact with the film formation substrate, a contact area reducing structure for reducing an area of contact with the film formation substrate.

7. The method according to claim 1, wherein:
an electrostatic chuck is in contact with a first surface of the film formation substrate, the first surface being opposite to a second surface of the film formation substrate which second surface faces the vapor deposition mask, and that holds the film formation substrate.

8. The method according to claim 7, wherein:
the electrostatic chuck has, on a surface in contact with the film formation substrate, a contact area reducing structure for reducing an area of contact with the film formation substrate.

9. The method according to claim 6, wherein:
the contact area reducing structure is a hemispheric protruding structure.

10. The method according to claim 1, wherein:
the vapor deposition mask is a rectangular vapor deposition mask that has (i) along a short-axis direction thereof, a side shorter than a width of the vapor deposition region along a side facing the short-axis direction of the vapor deposition mask and that has (ii) along a long-axis direction thereof, a side longer than a width of the vapor deposition region along a side facing the long-axis direction of the vapor deposition mask.

11. The method according to claim 1, wherein a first alignment marker on the film formation substrate and a second alignment marker on the vapor deposition mask, the method further comprising:
aligning the film formation substrate and the vapor deposition mask with use of the first and second alignment markers.

12. The method according to claim 1, wherein:
the mask unit is provided so that the emission hole faces the opening of the vapor deposition mask in a one-to-one correspondence.

13. The method according to claim 1, wherein:
the vapor deposition films each having the predetermined pattern are each an organic layer for an organic electroluminescent device.

14. The method according to claim 8, wherein:
the contact area reducing structure is a hemispheric protruding structure.

15. A method for forming, on a film formation substrate, vapor deposition films each having a predetermined pattern, the method comprising the steps of:

(I) forming a plurality of discontinuous partition walls each of which has a cross section in a reverse tapered shape such that the portion of the wall closer to the substrate is narrower than the portion further away from the substrate, and has a predetermined height and each of which stands between film formation regions on the film formation substrate, the plurality of discontinuous partition walls each being provided in such a pattern that no straight line passing through a discontinuous portion of the partition walls passes over a pixel light-emitting region of the film formation substrate, the pixel light-emitting region corresponding to respective pattern formation regions of the vapor deposition films;

(II) providing a mask unit so that the mask unit faces the film formation substrate, the mask unit including (i) a vapor deposition mask that has a plurality of openings and that is smaller in area than a vapor deposition region of the film formation substrate, wherein the vapor deposition mask includes an engaging section configured to engage with the partition wall, and (ii) a vapor deposition source that has an emission hole configured to emit vapor deposition particles, the emission hole being provided so as to face the vapor deposition mask, the vapor deposition mask and the vapor deposition source being separated by a fixed gap, and bringing the vapor deposition mask and the film formation substrate into contact with each other at the partition wall;

(III) depositing the vapor deposition particles onto the vapor deposition region of the film formation substrate through the opening of the vapor deposition mask while causing at least one of the vapor deposition mask and the film formation substrate to move relative to each other, the engaging section having a wall surface including a depressed portion, the depressed portion is tapered such that the portion closest to the substrate surface is narrower than the portion that is further from the substrate, such that the depressed portion has a shape complementary to the partition wall such that they are capable of interlocking, in the step (II), when the depressed portion of the vapor deposition mask is first brought into contact with the partition wall, the depressed portion of the vapor deposition mask having a larger width than a width of the partition wall or the width of the partition wall having a smaller width than the width of the depressed portion of the vapor deposition mask, so that the depressed portion of the vapor deposition mask and the partition wall are not interlocked with each other, and in the step (III), at least one of the vapor deposition mask and the film formation substrate being caused to move relative to each other so that the depressed portion of the vapor deposition mask and the reverse taper of the partition wall are interlocked with each other and the engaging section engages with the partition wall along a direction of the relative movement of the film formation substrate and the mask unit, and in a state where the depressed portion of the vapor deposition mask and the partition wall are interlocked with each other such that each of the respective reverse tapers are interlocked, while at least one of the mask unit and the film formation substrate is caused to move relative to each other, the vapor deposition particles being deposited onto the vapor deposition region of the film formation substrate.

16. The method according to claim 15, wherein:

the vapor deposition films each having the predetermined pattern are each an organic layer for an organic electroluminescent device.

* * * * *